US012563727B2

(12) United States Patent
Oh et al.

(10) Patent No.: US 12,563,727 B2
(45) Date of Patent: Feb. 24, 2026

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventors: Jae Young Oh, Icheon-si (KR); Eun Seok Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 766 days.

(21) Appl. No.: 17/702,412

(22) Filed: Mar. 23, 2022

(65) Prior Publication Data

US 2022/0359564 A1 Nov. 10, 2022

(30) Foreign Application Priority Data

May 6, 2021 (KR) ........................ 10-2021-0058774
Jan. 26, 2022 (KR) ........................ 10-2022-0011777

(51) Int. Cl.
| | |
|---|---|
| *H10B 43/27* | (2023.01) |
| *H01L 23/528* | (2006.01) |
| *H10B 41/27* | (2023.01) |
| *H10B 41/40* | (2023.01) |
| *H10B 43/40* | (2023.01) |

(52) U.S. Cl.
CPC ......... *H10B 43/27* (2023.02); *H01L 23/5283* (2013.01); *H10B 41/27* (2023.02); *H10B 41/40* (2023.02); *H10B 43/40* (2023.02)

(58) Field of Classification Search
CPC ........ H10B 43/27; H10B 41/40; H10B 43/40; H10B 41/27; H01L 23/5283
See application file for complete search history.

(56) References Cited

U.S. PATENT DOCUMENTS

| | | | |
|---|---|---|---|
| 7,354,826 B1 | 4/2008 | Orimoto et al. | |
| 10,629,616 B1 | 4/2020 | Kai et al. | |
| 10,804,291 B1 * | 10/2020 | Rajashekhar | H10B 43/27 |
| 2013/0115761 A1 | 5/2013 | Kim et al. | |
| 2015/0037949 A1 | 2/2015 | Lee | |
| 2015/0243672 A1 | 8/2015 | Kim | |
| 2017/0271362 A1 * | 9/2017 | Sonehara | H10B 41/27 |
| 2020/0258817 A1 | 8/2020 | Okina et al. | |
| 2021/0296348 A1 * | 9/2021 | Fukumaki | H10B 43/27 |
| 2022/0045088 A1 * | 2/2022 | Baraskar | H10B 43/27 |

FOREIGN PATENT DOCUMENTS

| | | |
|---|---|---|
| KR | 1020150100325 A | 9/2015 |
| KR | 1020170099687 A | 9/2017 |
| KR | 1020180119737 A | 11/2018 |
| KR | 1020200074573 A | 6/2020 |
| KR | 1020210012827 A | 2/2021 |
| KR | 1020210023291 A | 3/2021 |

* cited by examiner

*Primary Examiner* — Jacob Y Choi
*Assistant Examiner* — Neil R Prasad
(74) *Attorney, Agent, or Firm* — WILLIAM PARK AND ASSOCIATES LTD.

(57) ABSTRACT

A semiconductor memory device includes: a stack structure including a first interlayer insulating layer, and a plurality of second interlayer insulating layers and a plurality of conductive patterns, which are alternately disposed under the first interlayer insulating layer; a hole penetrating the stack structure; a core insulating pattern, a memory pattern, and a channel pattern, disposed inside the hole; and a doped semiconductor layer disposed over the first interlayer insulating layer, the doped semiconductor layer extending to the inside of the hole.

20 Claims, 45 Drawing Sheets

185B

101B

105(105B)

107(SSL)

109

107

109

125B

123

TI DS BI
121B

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2021-0058774, filed on May 6, 2021 and Korean patent application number 10-2022-0011777, filed on Jan. 26, 2022, in the Korean Intellectual Property Office, the entire disclosure of which is incorporated herein by reference.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device includes a plurality of memory cells capable of storing data. A three-dimensional semiconductor memory device may include a plurality of three-dimensionally arranged memory cells. As a plurality of memory cells are three-dimensionally arranged, the area of a substrate occupied by the plurality of memory cells can be decreased, and thus the degree of integration of a semiconductor memory device can be improved. The number of memory cells stacked over the substrate increases, so that the degree of integration of the semiconductor memory device can be further improved. As the number of memory cells stacked over the substrate increases, the operational reliability of the three-dimensional semiconductor memory device may be deteriorated.

SUMMARY

In accordance with an embodiment of the present disclosure, there may be provided a semiconductor memory device including: a plurality of second interlayer insulating layers and a plurality of conductive patterns, alternately disposed under a first interlayer insulating layer; a doped semiconductor layer over the first interlayer insulating layer; a spacer pattern between the doped semiconductor layer and the first interlayer insulating layer; a hole penetrating the spacer pattern, the first interlayer insulating layer, the plurality of second interlayer insulating layers, and the plurality of conductive patterns; a memory pattern on a sidewall of the hole; a core insulating pattern in a central region of the hole; and a channel pattern between the core insulating pattern and the memory pattern, wherein the doped semiconductor layer extends to the inside of the hole.

In accordance with an embodiment of the present disclosure, there may be provided a semiconductor memory device including: a stack structure including a first interlayer insulating layer having a first surface facing in a first direction and a second surface facing in a second direction opposite to the first direction, and a plurality of second interlayer insulating layers and a plurality of conductive patterns, which are alternately disposed in the second direction on the second surface of the first interlayer insulating layer; a core insulating pattern penetrating the stack structure; a channel pattern disposed between the core insulating pattern and the stack structure; a memory pattern disposed between the channel pattern and the stack structure; and a doped semiconductor layer disposed over the first surface of the first interlayer insulating layer, the doped semiconductor layer extending between the memory pattern and the core insulating pattern to be connected to the channel pattern, wherein the doped semiconductor layer includes a crystallization region extending between the memory pattern and the core insulating pattern from the channel pattern.

In accordance with an embodiment of the present disclosure, there may be provided a method of manufacturing a semiconductor memory device, the method including: forming a preliminary memory cell array structure including a first interlayer insulating layer on a base structure, a plurality of conductive patterns and a plurality of second interlayer insulating layers, which are alternately stacked on the first interlayer insulating layer, a memory layer on a surface of a hole which penetrates the plurality of conductive patterns, the plurality of the second interlayer insulating layers, and the first interlayer insulating layer and extends to the inside of the base structure, a core insulating layer disposed in a central region of the hole, and a channel layer between the memory layer and the core insulating layer; removing a portion of the preliminary memory cell array structure from a back surface of the base structure such that the core insulating layer is exposed; and forming a doped semiconductor layer on a spacer pattern defined by a remaining part of the base substrate, wherein the doped semiconductor layer is in contact with the channel layer, and overlaps with a sidewall of the spacer pattern.

In accordance with an embodiment of the present disclosure, there may be provided a method of manufacturing a semiconductor memory device, the method including: forming a preliminary memory cell array structure including a first interlayer insulating layer over a semiconductor layer, a plurality of conductive patterns and a plurality of second interlayer insulating layers, which are alternately stacked on the first interlayer insulating layer, a memory layer on a surface of a hole which penetrates the plurality of second interlayer insulating layers and the first interlayer insulating layer and extends to the inside of the semiconductor layer, a core insulating layer disposed in a central region of the hole, and a channel layer between the memory layer and the core insulating layer; removing a portion of the semiconductor layer from a back surface of the semiconductor layer such that the memory layer is exposed; defining a first recess part between the semiconductor layer and the channel layer by removing a portion of the memory layer; injecting an impurity into the semiconductor layer and the channel layer; and filling the first recess part with a melted semiconductor material by melting portions of the semiconductor layer and the channel layer.

BRIEF DESCRIPTION OF THE DRAWINGS

Various examples of embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. It will be understood that when an element, pattern, or layer etc., is referred to as being "on," "connected to" or "coupled to" another element, pattern, or layer etc., it can be directly on, connected or coupled to the other element, pattern, or layer etc., or intervening elements, patterns, or layers etc., may be present. In contrast, when an element, pattern, or layer etc., is referred to as being "directly on," "directly connected to" or "directly coupled to" another element, pattern, or layer etc., there are no intervening elements or layers present. Like reference numerals refer to like elements throughout the drawings.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

Various embodiments of the present disclosure are directed to a semiconductor memory device having improved operational reliability and a manufacturing method of the semiconductor memory device.

Figure 1:
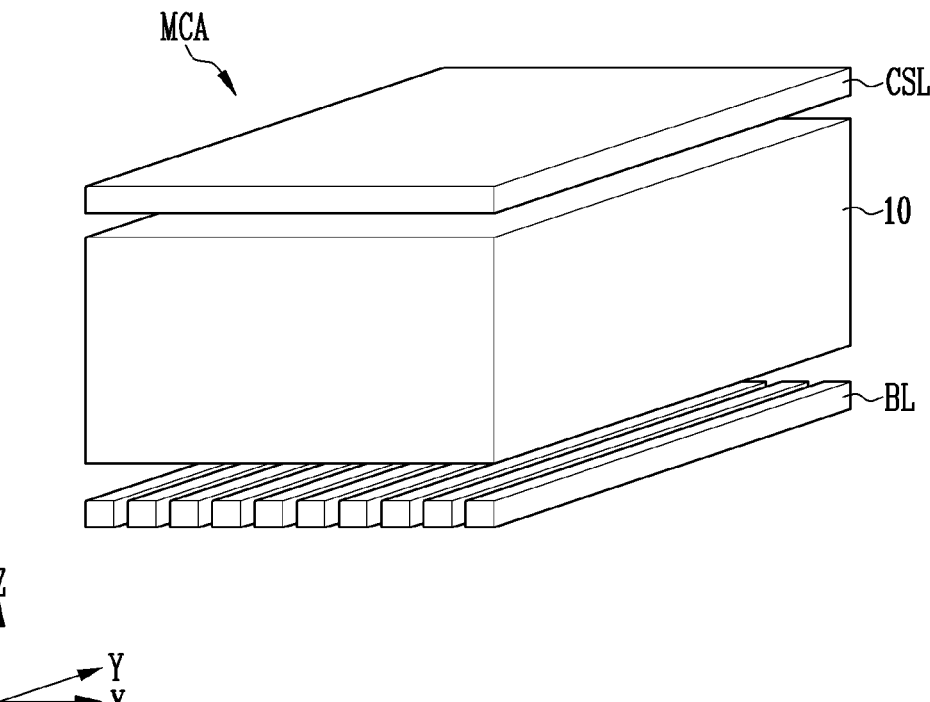
FIG. 1 is a view schematically illustrating a memory cell array of a semiconductor memory device in accordance with an embodiment of the present disclosure.

FIG. 1 is a view schematically illustrating a memory cell array of a semiconductor memory device in accordance with an embodiment of the present disclosure.

Referring to FIG. 1, the memory cell array MCA may include a plurality of bit lines BL, a common source layer CSL, and a memory block 10.

The plurality of bit lines BL may be spaced apart from each other, and extend in parallel to each other. In an embodiment, the plurality of bit lines BL may be spaced apart from each other in an X-axis direction, and extend in a Y-axis direction. However, the present disclosure is not limited thereto.

The common source layer CSL may overlap with the plurality of bit lines BL with the memory block 10 interposed therebetween. The common source layer CSL may include a horizontal pattern extending on an XY plane.

The memory block 10 may be disposed between the plurality of bit lines BL and the common source layer CSL. The memory block 10 may include a plurality of memory cell strings. Each memory cell string may be connected to not only a bit line BL corresponding thereto but also the common source layer CSL through a channel pattern of a cell plug.

Figure 2:
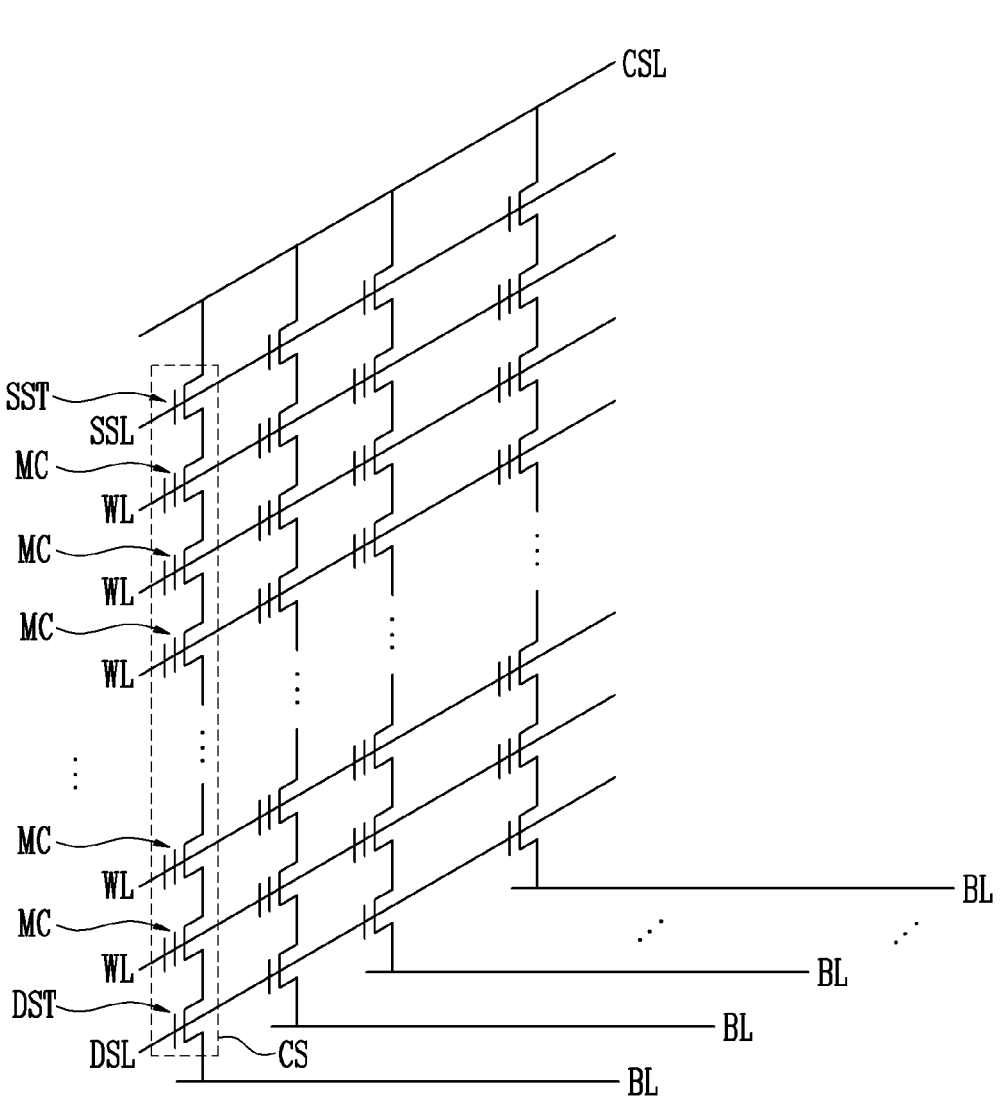
FIG. 2 is a circuit diagram illustrating the memory cell array shown in FIG. 1.

FIG. 2 is a circuit diagram illustrating the memory cell array MCA shown in FIG. 1.

Referring to FIG. 2, the memory cell array MCA may include a plurality of memory cell strings CS respectively connected to the plurality of bit lines BL. The plurality of memory cell strings CS may be connected in parallel to the common source layer CSL.

Each memory cell string CS may include at least one drain select transistor DST, a plurality of memory cells MC, and at least one source select transistor SST.

The plurality of memory cells MC may be connected in series between the drain select transistor DST and the source select transistor SST. The plurality of memory cells MC may be connected to the common source layer CSL via the source select transistor SST. The plurality of memory cells MC may be connected to a bit line BL corresponding thereto via the drain select transistor DST.

The plurality of memory cells MC may be respectively connected to a plurality of word lines WL. An operation of the plurality of memory cells MC may be controlled by gate signals applied to the plurality of word lines WL. The drain select transistor DST may be connected to a drain select line DSL. An operation of the drain select transistor DST may be controlled by a gate signal applied to the drain select line DSL. The source select transistor SST may be connected to a source select line SSL. An operation of the source select transistor SST may be controlled by a gate signal applied to the source select line SSL.

The source select line SSL, the plurality of word lines WL, and the drain select line DSL may be implemented by conductive patterns stacked to be spaced apart from each other.

Figure 3A:
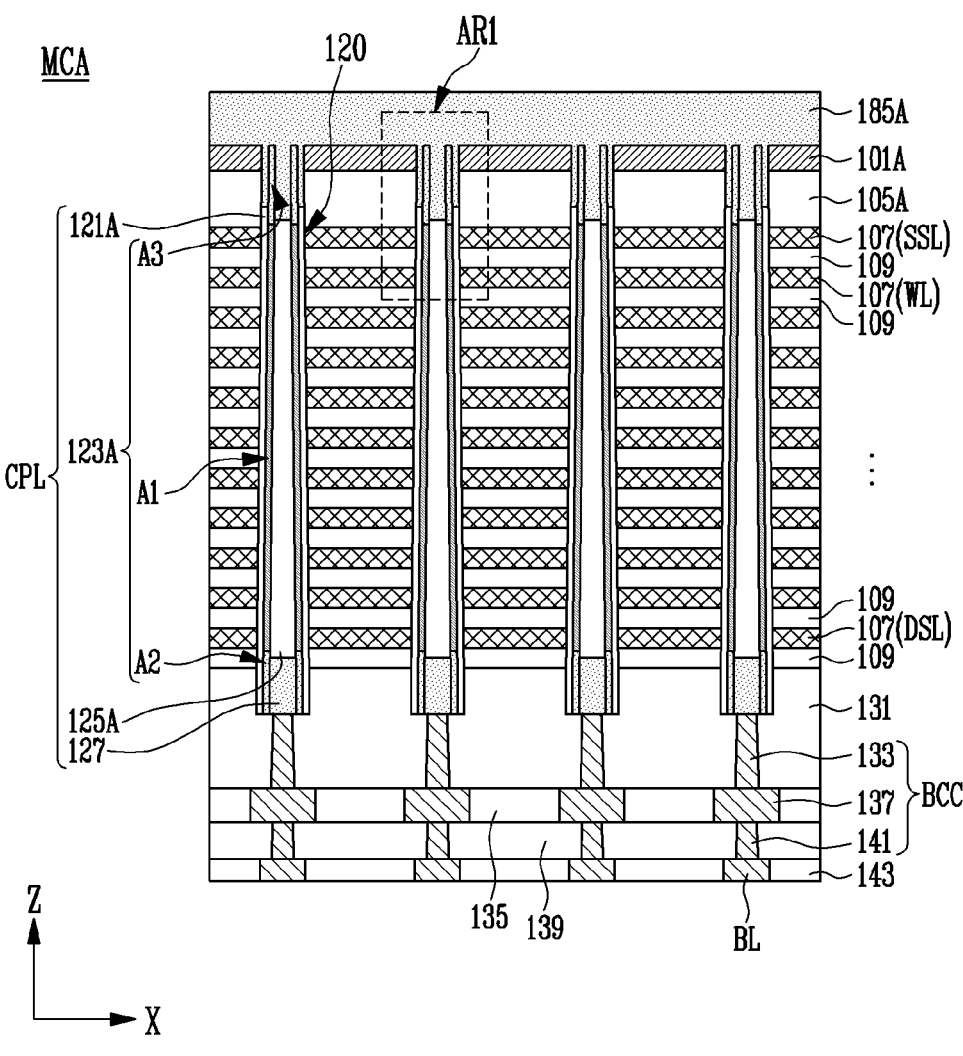
FIGS. 3A and 3B are sectional views illustrating an embodiment of the memory cell array shown in FIG. 1.
Figure 3B:
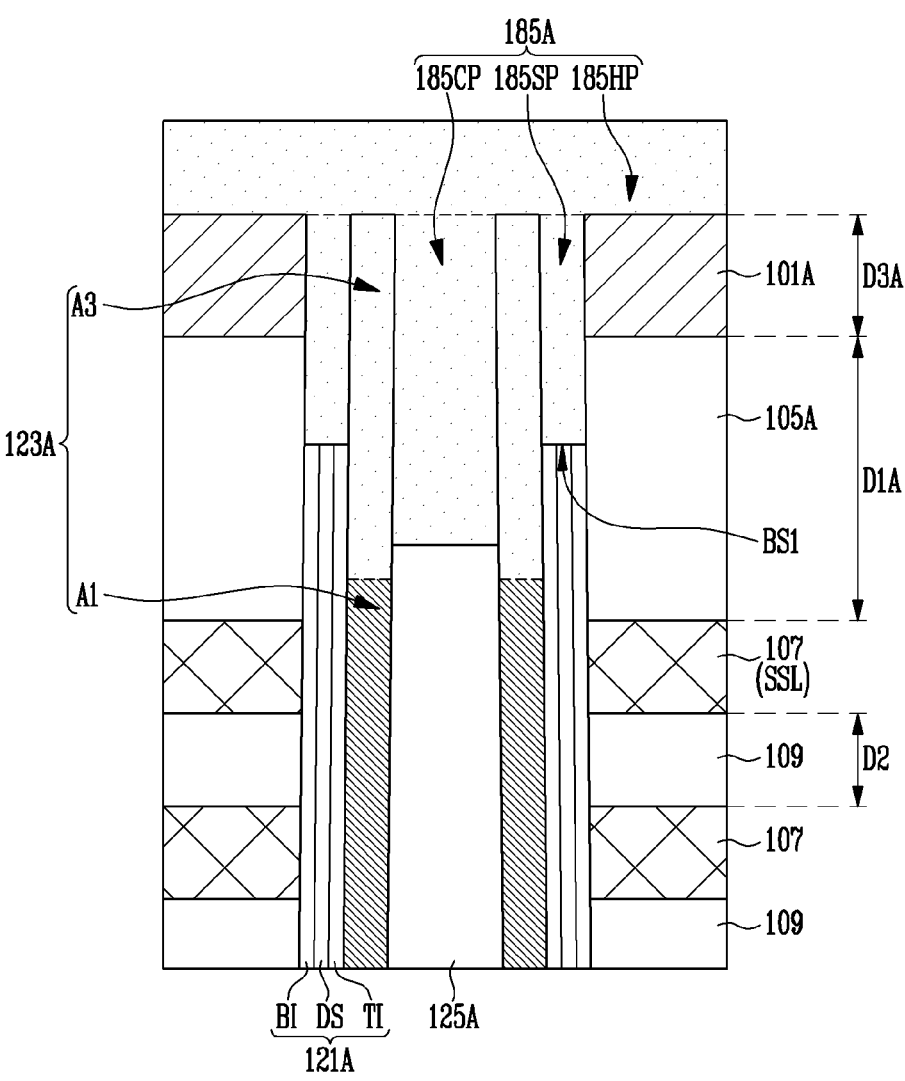

FIGS. 3A and 3B are sectional views illustrating an embodiment of the memory cell array MCA shown in FIG. 1. FIG. 3A is a sectional view of the memory cell array MCA taken along a direction intersecting the plurality of bit lines BL, and FIG. 3B is an enlarged sectional view of region AR1 shown in FIG. 3A.

Referring to FIGS. 3A and 3B, the memory cell array MCA may include a doped semiconductor layer 185A, a spacer pattern 101A, a first interlayer insulating layer 105A, a plurality of conductive patterns 107, a plurality of second interlayer insulating layers 109, a cell plug CPL, and a bit line BL.

The plurality of conductive patterns 107 and the plurality of second interlayer insulating layers 109 may be alternately disposed under the first interlayer insulating layer 105A. More specifically, the plurality of conductive patterns 107 and the plurality of second interlayer insulating layers 109 may be disposed between the first interlayer insulating layer 105A and the bit line BL, and be alternately disposed one by one in a Z-axis direction.

The first interlayer insulating layer 105A and each second interlayer insulating layer 109 may include the same insulating material. In an embodiment, the first interlayer insulating layer 105A and the second interlayer insulating layer 109 may include silicon oxide.

The plurality of conductive patterns 107 may be spaced apart from the spacer pattern 101A by the first interlayer insulating layer 105A. The plurality of conductive patterns 107 may be insulated from each other by the plurality of second interlayer insulating layers 109. At least one conductive pattern adjacent to the first interlayer insulating layer 105A among the plurality of conductive patterns 107 may be used as the source select line SSL described with reference to FIG. 2. At least one conductive pattern adjacent to the bit line BL among the plurality of conductive patterns 107 may be used as the drain select line DSL described with reference to FIG. 2. Among the plurality of conductive patterns 107, conductive patterns disposed between the conductive pattern used as the source select line SSL and the conductive pattern used as the drain select line DSL may be used as the word lines WL described with reference to FIG. 2.

The spacer pattern 101A may be disposed on the first interlayer insulating layer 105A. The spacer pattern 101A may include a semiconductor layer. In an embodiment, the semiconductor layer may include single crystalline silicon.

The spacer pattern 101A, the first interlayer insulating layer 105A, the plurality of conductive patterns 107, and the plurality of second interlayer insulating layers 109 may be penetrated by a hole 120. The cell plug CPL may be disposed in the hole 120.

The memory cell array MCA may include a first insulating layer 131 disposed between a stack structure of the plurality of conductive patterns 107 and the plurality of second interlayer insulating layers 109 and the bit line BL. The cell plug CPL may extend to the inside of the first insulating layer 131.

The cell plug CPL may include a memory pattern 121A, a channel pattern 123A, a core insulating pattern 125A, and a capping pattern 127.

The memory pattern 121A may extend along a sidewall of the hole 120. As shown in FIG. 3B, the memory pattern 121A may include a blocking insulating layer BI, a data storage layer DS, and a tunnel insulating layer TI. The blocking insulating layer BI may include a metal oxide layer, a silicon oxide layer, etc. The data storage layer DS may be configured as a material layer capable of storing data changed using Fowler-Nordheim tunneling. The material layer may include a nitride layer in which charges can be trapped. However, the embodiment of the present disclosure is not limited thereto, and the data storage layer DS may include a nano dot, etc. The tunnel insulating layer TI may include an insulating material through which charges can tunnel. In an embodiment, the tunnel insulating layer TI may include a silicon oxide layer.

The core insulating pattern 125A and the capping pattern 127 may be disposed in a central region of the hole 120. The capping pattern 127 may be disposed between the core insulating pattern 125A and the bit line BL. The capping pattern 127 may include a doped semiconductor layer. In an embodiment, the capping pattern 127 may include a doped silicon layer including an n-type impurity.

The channel pattern 123A may be disposed between the core insulating pattern 125A and the memory pattern 121A. The channel pattern 123A may further protrude in the Z-axis direction than the core insulating pattern 125A. The channel pattern 123A may include a portion further protruding toward the bit line BL than the core insulating pattern 125A to surround a sidewall of the capping pattern 127. The channel pattern 123A may include a semiconductor layer. The channel pattern 123A may include a channel region A1, a drain junction A2, and a source junction A3. The channel region A1 of the channel pattern 123A may be disposed between the drain junction A2 and the source junction A3.

A portion of the semiconductor layer, which constitutes the channel region A1, may be substantially intrinsic. Portions of the semiconductor layer, which constitute the drain junction A2 and the source junction A3, may include a conductivity type impurity. The drain junction A2 of the channel pattern 123A may be in contact with the capping pattern 127. The source junction A3 of the channel pattern 123A may be in contact with the doped semiconductor layer 185A. Each of the drain junction A2 and the source junction A3 may further extend toward the channel region A1 than the doped semiconductor layer 185A and the capping pattern 127. The drain junction A2 of the channel pattern 123A may include the same conductivity type impurity as the capping pattern 127. The source junction A3 of the channel pattern 123A may include the same conductivity type impurity as the doped semiconductor layer 185A. In an embodiment, the drain junction A2 and the source junction A3 may include an n-type impurity.

The doped semiconductor layer 185A may be used as the common source layer CSL shown in FIGS. 1 and 2. The doped semiconductor layer 185A may be disposed over the first interlayer insulating layer 105A with the spacer pattern 101A interposed therebetween. That is, the spacer pattern 101A may be interposed between the doped semiconductor layer 185A and the first interlayer insulating layer 105A. The doped semiconductor layer 185A may include at least one of an n-type impurity and a p-type impurity. In an embodiment, the doped semiconductor layer 185A may include an n-type impurity.

The doped semiconductor layer 185A may extend to the inside of the hole 120 to overlap with a sidewall of the spacer pattern 101A. More specifically, the doped semiconductor layer 185A may include a horizontal pattern 185HP, a core pattern 185CP, and a sidewall pattern 185SP. The horizontal pattern 185HP of the doped semiconductor layer 185A may be disposed on the spacer pattern 101A, and extend on the XY plane like the common source layer CSL shown in FIG.

1. The core pattern 185CP of the doped semiconductor layer 185A may protrude to the inside of the hole 120 toward the core insulating pattern 125A from the horizontal pattern 185HP. The sidewall pattern 185SP of the doped semiconductor layer 185A may extend along the sidewall of the hole 120 toward the memory pattern 121A from the horizontal pattern 185HP. That is, the sidewall pattern 185SP of the doped semiconductor layer 185A may be interposed between the channel pattern 123A and the spacer pattern 101A. Accordingly, the channel pattern 123A may be interposed between the core pattern 185CP and the sidewall pattern 185SP of the doped semiconductor layer 185A.

The memory cell array MCA may further include at least one insulating layer disposed between the first insulating layer 131 and the bit line BL. In an embodiment, the memory cell array MCA may include a second insulating layer 135 between the first insulating layer 131 and the bit line BL, and a third insulating layer 139 between the second insulating layer 135 and the bit line BL. The bit line BL may penetrate a fourth insulating layer 143 overlapping with the third insulating layer 139. The bit line BL may be connected to the capping pattern 127 of the cell plug CPL via a bit line-channel connection structure BCC. The bit line-channel connection structure BCC may include conductive patterns having various structures. In an embodiment, the bit line-channel connection structure BCC first conductive plug 133 extending to penetrate the first insulating layer 131 from the capping pattern 127, a conductive pad 137 extending to penetrate the second insulating layer 135 from the first conductive plug 133, and a second conductive plug 141 extending to penetrate the third insulating layer 139 from the conductive pad 137.

Referring to FIG. 3B, an interface BS1 between the memory pattern 121A and the sidewall pattern 185SP of the doped semiconductor layer 185A may be spaced apart from the source select line SSL. More specifically, the interface BS1 may be disposed at a level higher than that at which the source select line SSL is disposed. The level of the interface BS1 may be controlled by the spacer pattern 101A in a process of manufacturing the semiconductor memory device. In accordance with the embodiment of the present disclosure, a distance between the interface BS1 and the source select line SSL may be secured through the spacer pattern 101A, and thus a failure in which the source select line SSL and the doped semiconductor layer 185A are in contact with each other may be reduced.

In order to increase the above-described distance between the interface BS1 and the source select line SSL, a thickness D1A of the first interlayer insulating layer 105A may be made greater than that D2 of the second interlayer insulating layer 109. A thickness D3A of the spacer pattern 101A may be diverse. In an embodiment, the thickness D3A of the spacer pattern 101A may be less than that D1A of the first interlayer insulating layer 105A.

A turn-on current of the source select transistor connected to the source select line SSL may be increased as the distance between the doped semiconductor layer 185A and the source select line SSL is narrowed. In order to increase the turn-on current of the source select transistor, the core pattern 185CP of the doped semiconductor layer 185A may extend longer in the Z-axis direction than the sidewall pattern 185SP of the doped semiconductor layer 185A.

In accordance with the present disclosure, the gap between the source select line SSL and the doped semiconductor layer 185A may be stably maintained by the spacer pattern 101A, and the turn-on current of the source select transistor may be increased by the core pattern 185CP.

Figure 4A:
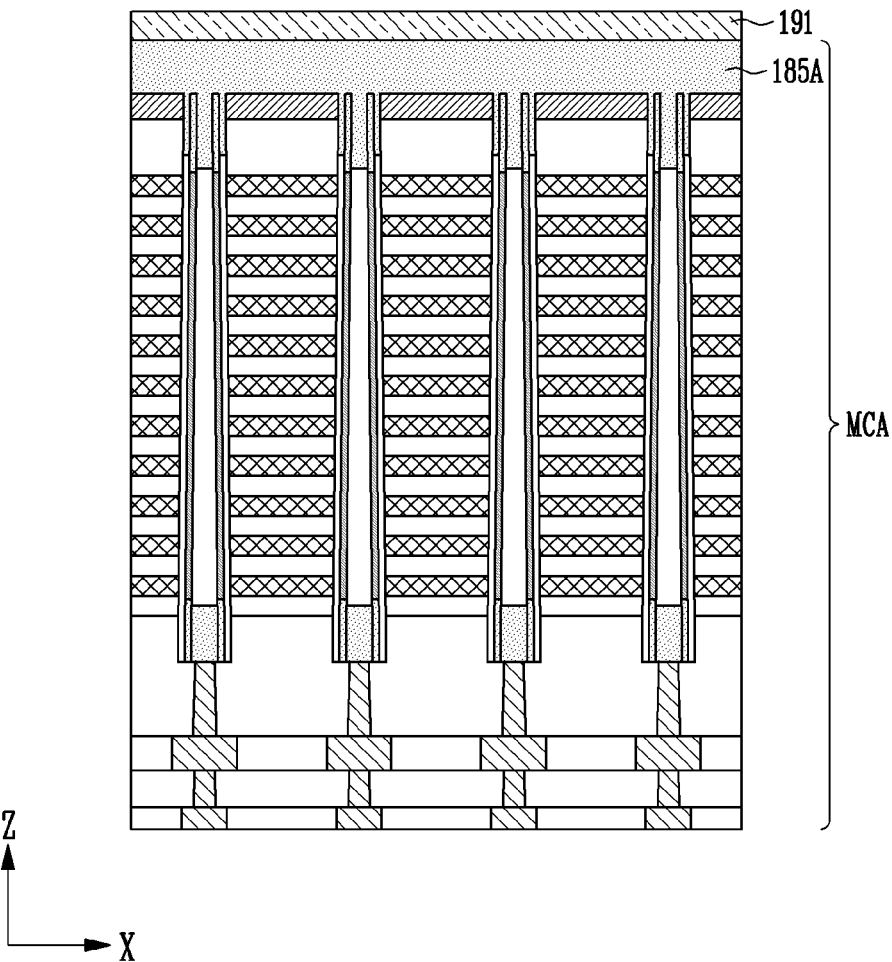
FIGS. 4A and 4B are sectional views illustrating a semiconductor memory device in accordance with an embodiment of the present disclosure.
Figure 4B:
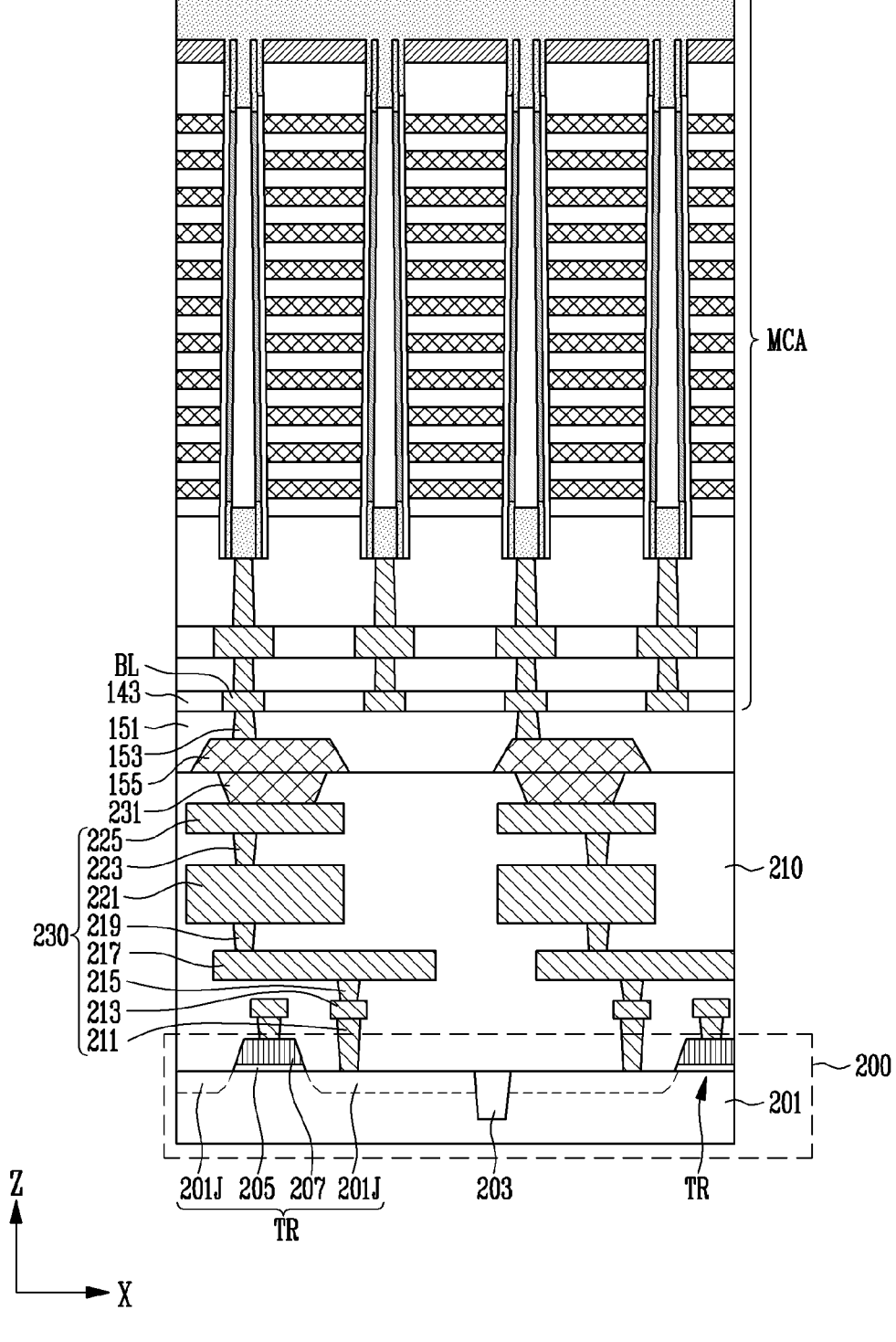

FIGS. 4A and 4B are sectional views illustrating a semiconductor memory device in accordance with an embodiment of the present disclosure. More specifically, FIG. 4A is a sectional view illustrating an embodiment of a structure disposed over the memory cell array MCA shown in FIG. 3A, and FIG. 4B is a sectional view illustrating an embodiment of a structure disposed under the memory cell array MCA shown in FIG. 3A.

Referring to FIG. 4A, the semiconductor memory device may further include a metal layer 191. The metal layer 191 may be in contact with the doped semiconductor layer 185A of the memory cell array MCA described with reference to FIGS. 3A and 3B on the doped semiconductor layer 185A. The metal layer 191 and the doped semiconductor layer 185A may be used as the common source layer CSL shown in FIGS. 1 and 2. The resistance of the common source layer CSL may be decreased by the metal layer 191.

Referring to FIG. 4B, the semiconductor memory device may include a peripheral circuit structure 200, a first interconnection 153, a second interconnection 230, a first conductive bonding pad 155, and a second conductive bonding pad 231. The peripheral circuit structure 200, the first interconnection 153, the second interconnection 230, the first conductive bonding pad 155, and the second conductive bonding pad 231 may be disposed under the memory cell array MCA described with reference to FIGS. 3A and 3B.

The first interconnection 153 and the second interconnection 230 may be connected to each other by a mutual connection structure of the first conductive bonding pad 155 and the second conductive bonding pad 231. In an embodiment, the first conductive bonding pad 155 and the second conductive bonding pad 231 may be coupled to each other through a bonding process.

The peripheral circuit structure 200 may include a substrate 201 and a plurality of transistors TR. The substrate 201 may be a semiconductor substrate including silicon, germanium, etc. The substrate 201 may include active regions divided by isolation layers 203.

The plurality of transistors TR may constitute a peripheral circuit for controlling an operation of the memory cell array MCA. In an embodiment, the plurality of transistors TR may include a transistor of a page buffer circuit for controlling a bit line BL. Each transistor TR may include a gate insulating layer 205, a gate electrode 207, and junctions 201J. The gate insulating layer 205 and the gate electrode 207 may be stacked on the active region of the substrate 201. The junctions 201J may be provided as a source region and a drain region. The junctions 201J may be provided by doping at least one of an n-type impurity and a p-type impurity into the active regions exposed at both sides of the gate electrode 207.

The first interconnection 153 and the first conductive bonding pad 155 may be formed in a cell array-side insulating structure 151. The cell array-side insulating structure 151 may include two or more insulating layers. The first interconnection 153 may include a conductive pattern having various structures. The first conductive bonding pad 155 may be connected to the bit line BL via the first interconnection 153.

The second interconnection 230 and the second conductive bonding pad 231 may be formed in a peripheral circuit-side insulating structure 210. The peripheral circuit-side insulating structure 210 may include two or more insulating layers. The second interconnection 230 may include a plurality of conductive patterns 211, 213, 215, 217, 219, 221, 223, and 225 connected to the transistor TR. The plurality of conductive patterns 211, 213, 215, 217, 219, 221, 223, and 225 may be formed in various structures. The second conductive bonding pad 231 may be connected to the transistor TR via the second interconnection 230.

According to the above-described structure, the bit line BL may be connected to the transistor TR via the first interconnection 153, the first conductive bonding pad 155, the second conductive bonding pad 231, and the second interconnection 230.

FIGS. 5A to 5E are sectional views illustrating memory cell arrays in accordance with embodiments of the present disclosure. In particular, FIGS. 5A to 5E are enlarged sectional views illustrating various embodiments of the region AR1 shown in FIG. 3A. Hereinafter, overlapping descriptions of the same components will be omitted.

Referring to FIG. 5A to 5E, because first interlayer insulating layers 105B and 105 may be protected by spacer patterns 101B and 101, the first interlayer insulating layers 105B and 105 may maintain a constant thickness while the semiconductor memory device is manufactured. Doped semiconductor layers 185B, 185C, 185D, 185E, and 185F may be stably spaced from the stack structure of the plurality of conductive patterns 107 and the plurality of second interlayer insulating layers 109 by the spacer patterns 101B and 101.

Each of the doped semiconductor layers 185B, 185C, 185D, 185E, and 185F may include a horizontal pattern 185HP and a core pattern 185CP extending from the horizontal pattern 185HP. A sidewall pattern 185SP extends from the horizontal pattern 185HP of each of the doped semiconductor layers 185B, 185C, 185E, and 185F as shown in FIGS. 5A, 5B, 5D, and 5E, and may have a length shorter than that of the core pattern 185CP. For example, referring to FIG. 5A, the sidewall pattern 185SP may have a length L1 shorter than a length L2 of the core pattern 185CP. Alternatively, the sidewall patter 185SP may be omitted as shown in FIG. 5C.

The length of the core pattern 185CP and the length of the sidewall pattern 185SP may be controlled by etch selectivities of core insulating patterns 125B, 125C, 125D, 125E, and 125F with respect to a tunnel insulating layer TI, a data storage layer DS, and a blocking insulating layer BI of each of memory patterns 121B, 121C, 121D, 121E, and 121F. In accordance with the present disclosure, each of the core insulating patterns 125B, 125C, 125D, 125E, and 125F may be etched deeper than the tunnel insulating layer TI, the data storage layer DS, and the blocking insulating layer BI. Accordingly, the length of core pattern 185CP may be formed longer than that of the sidewall pattern 185SP as shown in FIGS. 5A, 5B, 5D, and 5E, or an interface between the horizontal pattern 185HP and the memory pattern 121D may be disposed at a level substantially the same as a level of an interface between the horizontal pattern 185HP and the spacer pattern 101 as shown in FIG. 5C.

The length of a source junction A3 of each of channel patterns 123B, 123C, 123D, 123E, and 123F may be controlled by the length of the core pattern 185CP and the length of the sidewall pattern 185SP. The source junction A3 may further protrude toward a channel region A1 than the core pattern 185CP.

FIGS. 5A to 5E illustrate a case where each of the spacer patterns 101B and 101 includes a semiconductor layer, but the present disclosure is not limited thereto.

Figure 5A:
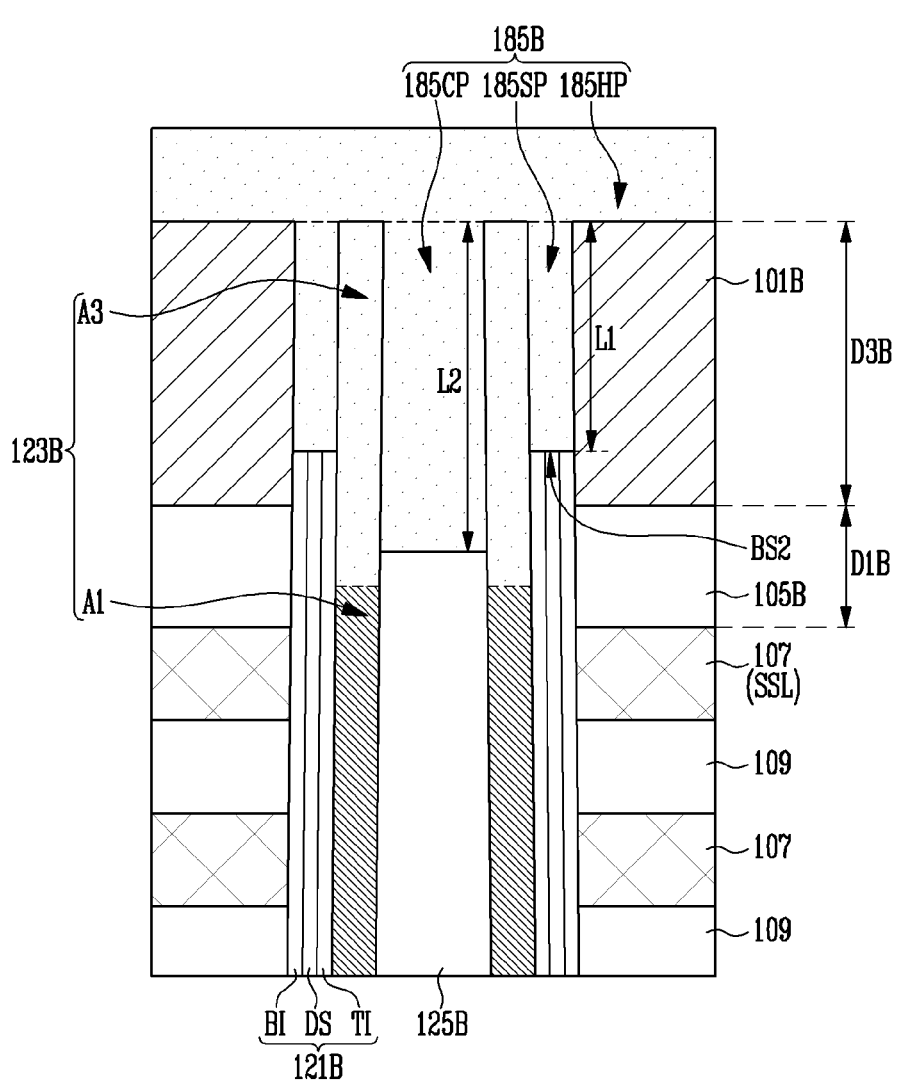
FIGS. 5A, 5B, 5C, 5D, and 5E are sectional views illustrating memory cell arrays in accordance with embodiments of the present disclosure.

Referring to FIG. 5A, a thickness D3B of the space pattern 101B may be formed greater than that D1B of the first interlayer insulating layer 105B. Accordingly, the position of an interface BS2 between the memory pattern 121B and the sidewall pattern 185SP may be controlled to become a level higher than that of the stack structure of the plurality of conductive patterns 107 and the plurality of second interlayer insulating layers 109. More specifically, the interface BS2 may be located at a level higher than that of the source select line SSL adjacent to the first interlayer insulating layer 105B among the plurality of conductive patterns 107.

Figure 5B:
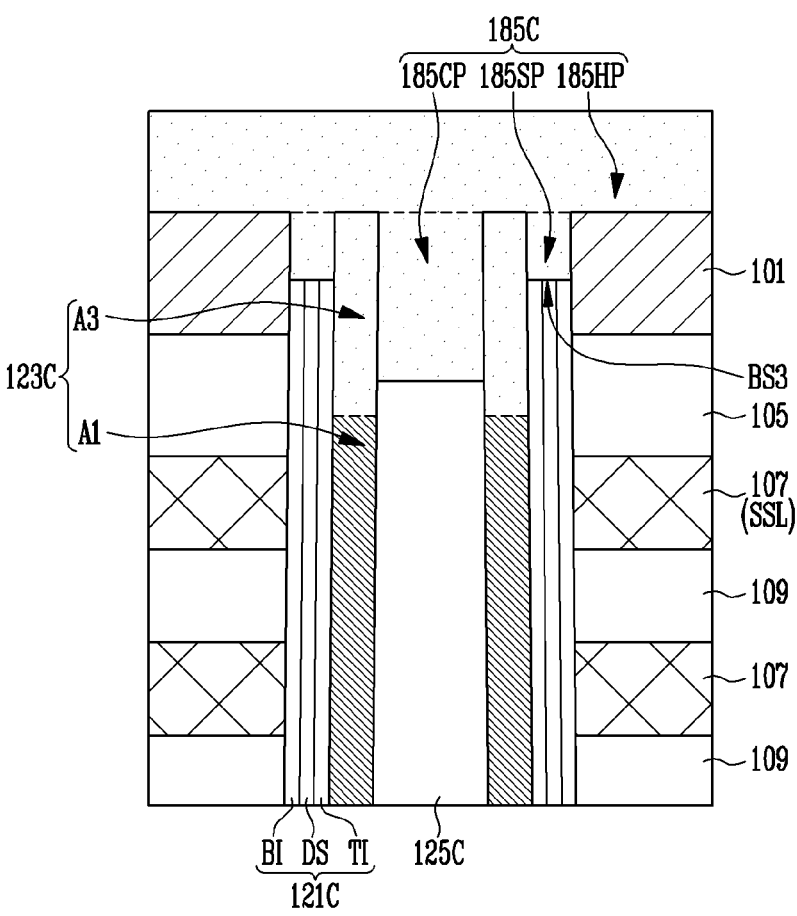
Figure 5C:
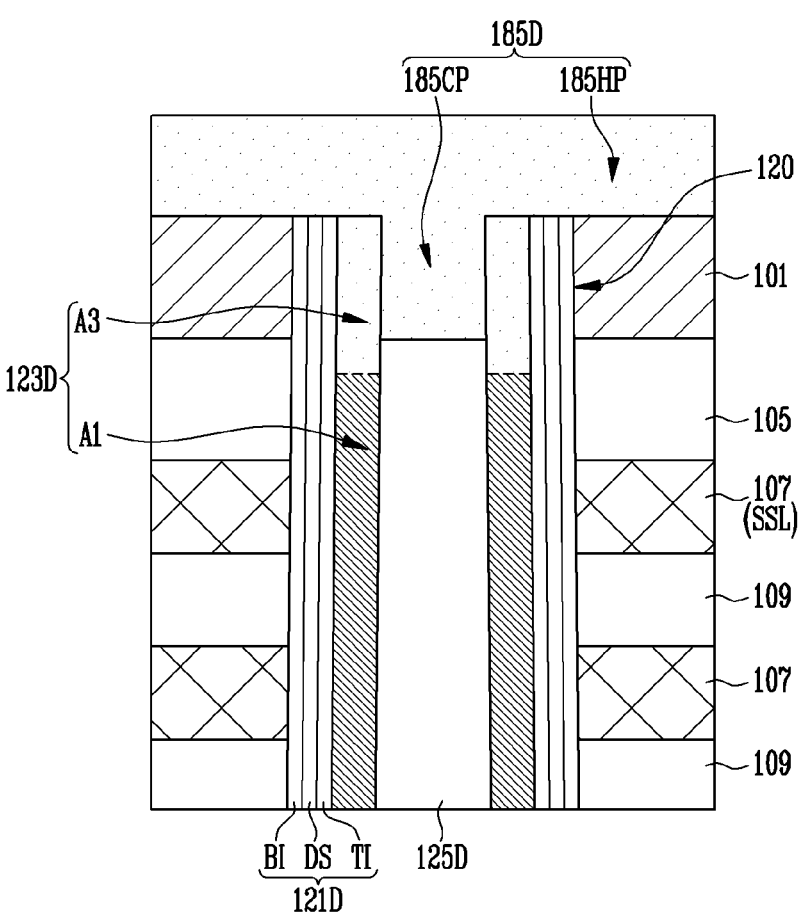

Referring to FIGS. 5B and 5C, the spacer pattern 101 may be formed thinner than the spacer pattern 101B shown in FIG. 5A. In an embodiment, the spacer pattern 101 may remain with a thickness substantially equal to that of the first interlayer insulating layer 105.

In accordance with an embodiment, as shown in FIG. 5B, an etching amount of the memory pattern 123C is controlled, so that the level of an interface BS3 between the memory pattern 123C and the sidewall pattern 185SP may be controlled. More specifically, the interface BS3 may be located at a level higher than that of the source select line SSL adjacent to the first interlayer insulating layer 105 among the plurality of conductive patterns 107.

In accordance with another embodiment, as shown in FIG. 5C, the horizontal part 185HP of the doped semiconductor layer 185D may be in contact with the memory pattern 123D. The core pattern 185CP of the doped semiconductor layer 185D may protrude toward the core insulating pattern 125D from the horizontal patter 185HP of the doped semiconductor layer 185D, and fill a central region of an end portion of the hole 120 penetrating the first interlayer insulating layer 105.

Figure 5D:
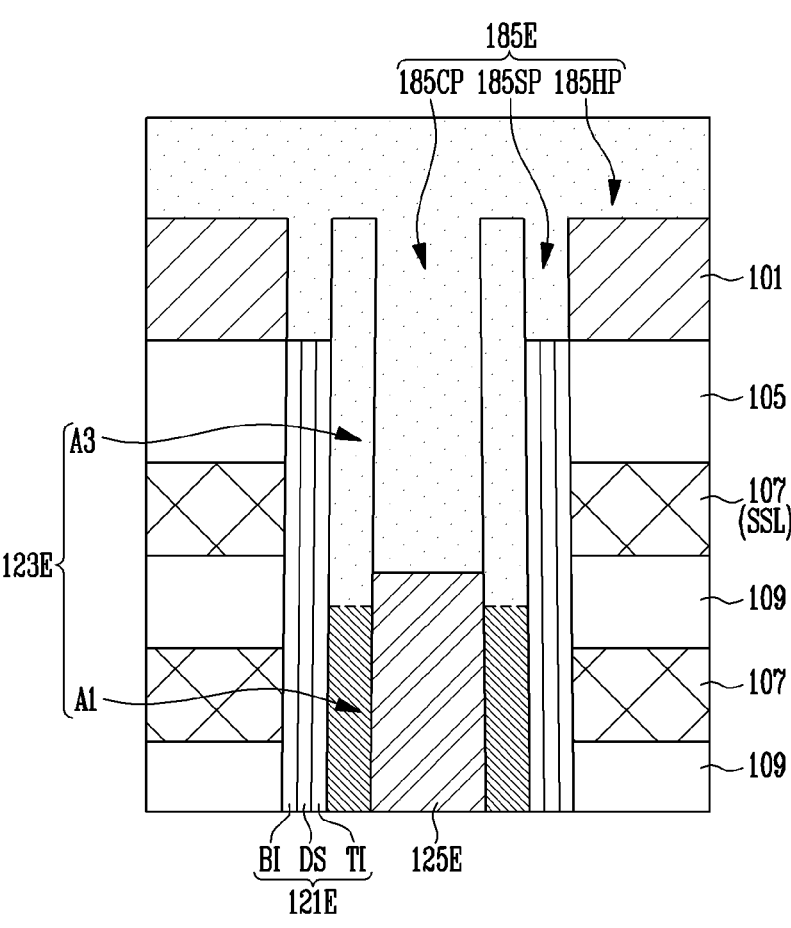

Referring to FIG. 5D, in order to further increase a turn-on current of the source select transistor connected to the source select line SSL, the core pattern 185CP of the doped semiconductor layer 185E may extend at a level at which the source select line SSL adjacent to the first interlayer insulating layer 105 among the plurality of conductive patterns 107 is disposed or a level thereunder. To this end, an etch selectivity of the core insulating pattern 125E with respect to the memory pattern 121E may be increased as compared with an etch selectivity of the core insulating patterns 125A, 125B, 125C, or 125D shown in FIGS. 3B, 5A, 5B, or 5C with respect to the corresponding memory pattern.

In an embodiment, the core insulating patterns 125A, 125B, 125C, and 125D shown in FIGS. 3B, 5A, 5B, and 5C may include oxide of polysilazane (PSZ), and the core insulating pattern 125E shown in FIG. 5D may include a porous insulating material. In another embodiment, the core insulating pattern 125E shown in FIG. 5D may include oxide of PSZ, which has a hardness lower than those of the core insulating patterns 125A, 125B, 125C, and 125D shown in FIGS. 3B, 5A, 5B, and 5C.

Figure 5E:
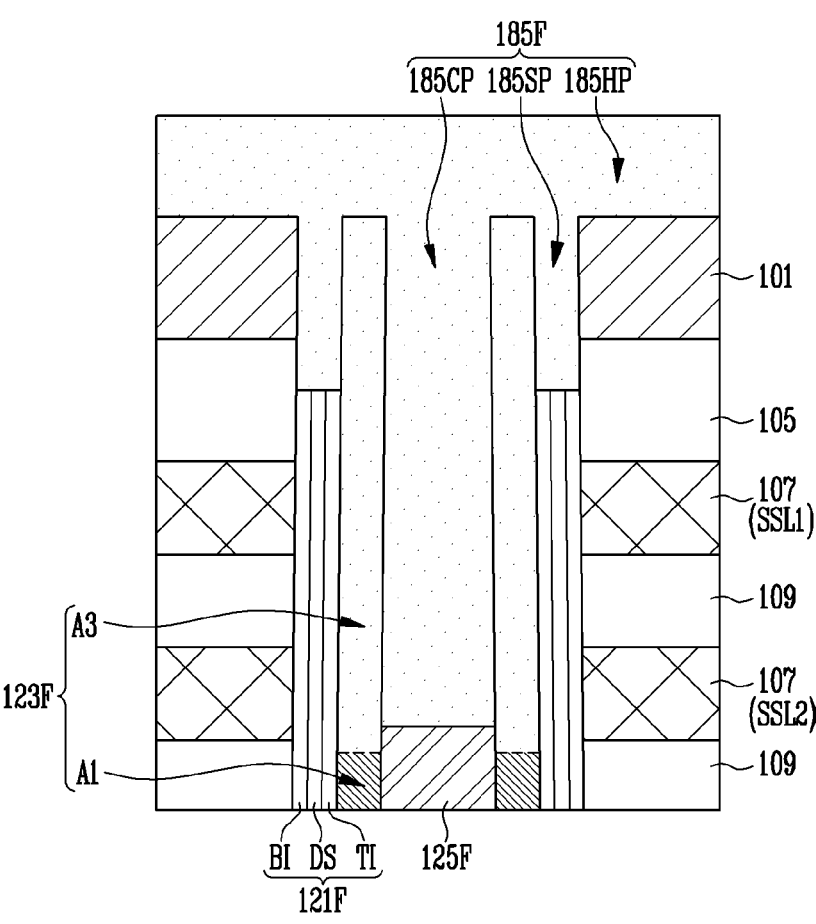

Referring to FIG. 5E, the plurality of conductive patterns 107 may include a first source select line SSL1 adjacent to the first interlayer insulating layer 105 and a second source select line SSL2 under the first source select line SSL1. The core pattern 185CP of the doped semiconductor layer 185F may extend at a level at which the second source select line SSL2 is disposed. To this end, the core insulating pattern 125F is made of the same material as the core insulating pattern 125E described above with reference to FIG. 5D, and an etching amount of the core insulating pattern 125F may be increased as compared with that of the core insulating pattern 125E shown in FIG. 5D.

Figure 6:
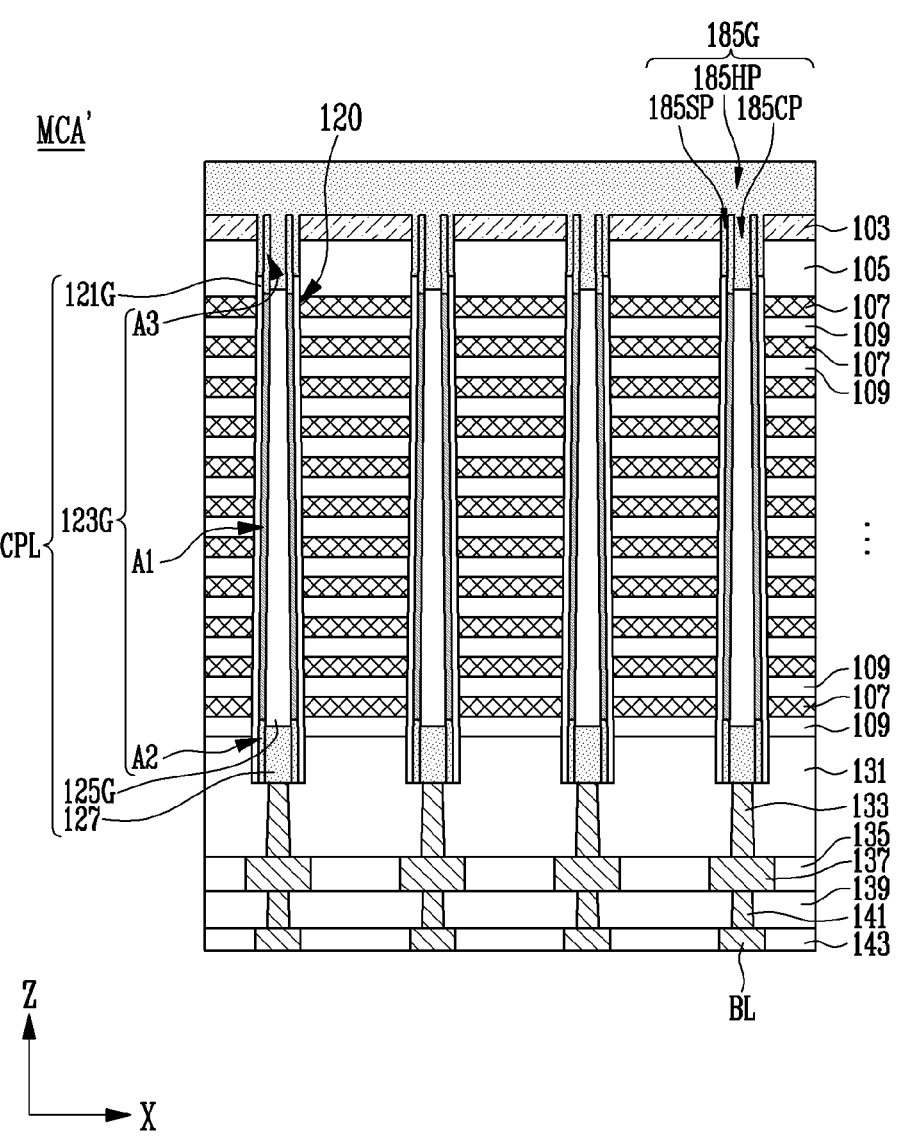
FIG. 6 is a sectional view illustrating a memory cell array in accordance with an embodiment of the present disclosure.

FIG. 6 is a sectional view illustrating a memory cell array in accordance with an embodiment of the present disclosure. More specifically, FIG. 6 is a sectional view of a memory cell array MCA' taken along a direction intersecting bit lines BL. Hereinafter, overlapping descriptions of the same components will be omitted.

Referring to FIG. 6, the memory cell array MCA' may include a doped semiconductor layer 185G, a spacer pattern 103, a first interlayer insulating layer 105, a plurality of conductive patterns 107, a plurality of second interlayer insulating layers 109, a cell plug CPL, and a bit line BL. Also, the memory cell array MCA' may include a first insulating layer 131, a second insulating layer 135, a third insulating layer 139, a fourth insulating layer 143, a first conductive plug 133, a conductive pad 137, and a second conductive plug 141.

The spacer pattern 103 may be made of a material having an etch selectivity with respect to a semiconductor layer. In an embodiment, the spacer pattern 103 may include at least one of a silicon carbide nitride (SiCN) layer and a silicon nitride (SiN) layer.

The cell plug CPL may include a memory pattern 121G, a channel pattern 123G, a core insulating pattern 125G, and a capping pattern 127. The channel pattern 123G may include a channel region A1, a drain junction A2, and a source junction A3, and the doped semiconductor layer 185G may include a horizontal pattern 185HP, and a core pattern 185CP and a sidewall pattern 185SP, which extend from the horizontal pattern 185HP.

The channel pattern 123G may be defined along a contact surface between the channel pattern 123G and at least one of the sidewall pattern 185SP of the doped semiconductor layer 185G and the core pattern 185CP of the doped semiconductor layer 185G. The etching amount of the core insulating pattern 125G, the etching amount of the memory pattern 121G, the thickness of the first interlayer insulating layer 105, the thickness of the spacer pattern 103, the length of the sidewall pattern 185SP of the doped semiconductor layer 185G, and the length of the core pattern 185CP of the doped semiconductor layer 185G may be variously controlled as described with reference to FIGS. 5A to 5E.

The metal layer 191 shown in FIG. 4A may be disposed on the memory cell array MCA' shown in FIG. 6. The peripheral circuit structure 200, the first interconnection 153, the second interconnection 230, the first conductive bonding pad 155, and the second conductive bonding pad 231, which are shown in FIG. 4B, may be disposed under the memory cell array MCA' shown in FIG. 6.

Figure 7:
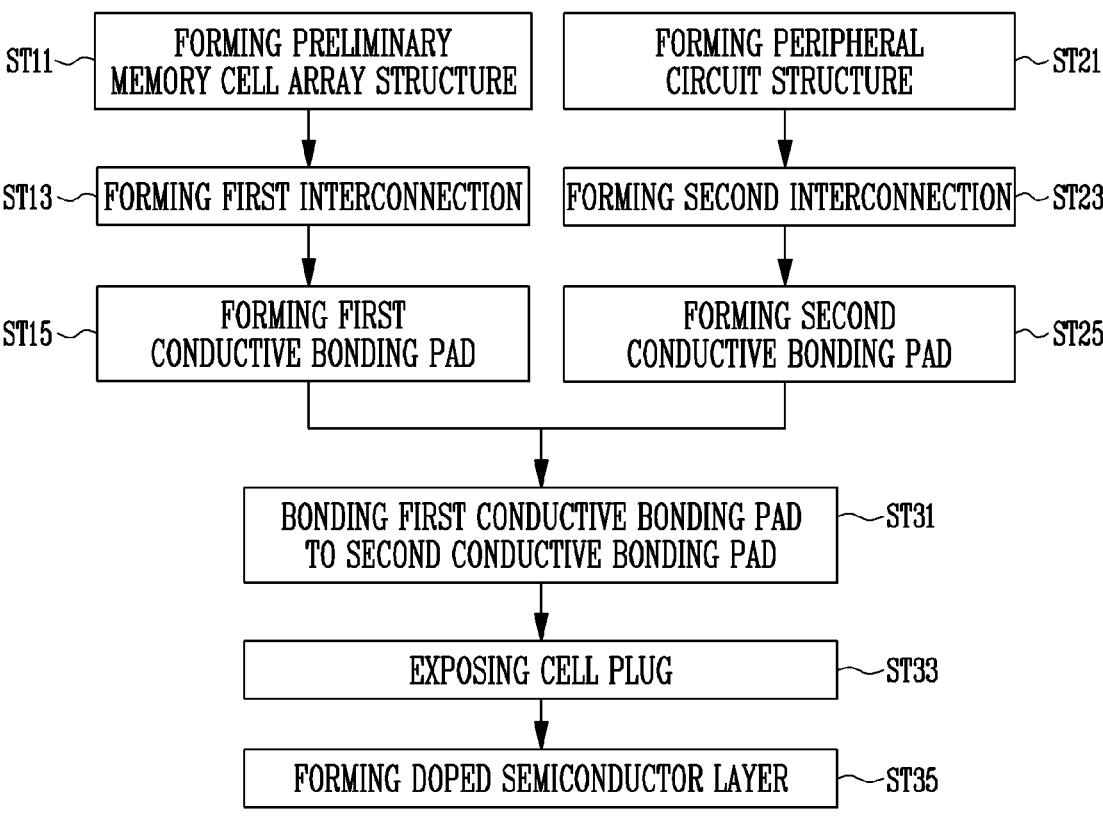
FIG. 7 is a flowchart schematically illustrating a manufacturing method of a semiconductor memory device in accordance with an embodiment of the present disclosure.

FIG. 7 is a flowchart schematically illustrating a manufacturing method of a semiconductor memory device in accordance with an embodiment of the present disclosure.

Referring to FIG. 7, the manufacturing method may include step ST11 of forming a preliminary memory cell array structure, step ST13 of forming a first interconnection, step ST15 of forming a first conductive bonding pad, step ST21 of forming a peripheral circuit structure, step ST23 of forming a second interconnection, step ST25 of forming a second conductive bonding pad, step ST31 of bonding the first conductive bonding pad to the second conductive bonding pad, step ST33 of exposing a cell plug, and step ST35 of forming a doped semiconductor layer.

The steps ST11 and ST21 may be individually performed. Accordingly, in an embodiment, a problem in which an electrical characteristic of the peripheral circuit structure is deteriorated by a high temperature required in the step ST11 may be mitigated or prevented in advance.

Hereinafter, the manufacturing method will be described in more detail with reference to process sectional views.

FIGS. 8A to 8D are sectional views illustrating embodiments of the step ST11 shown in FIG. 7.

Figure 8A:
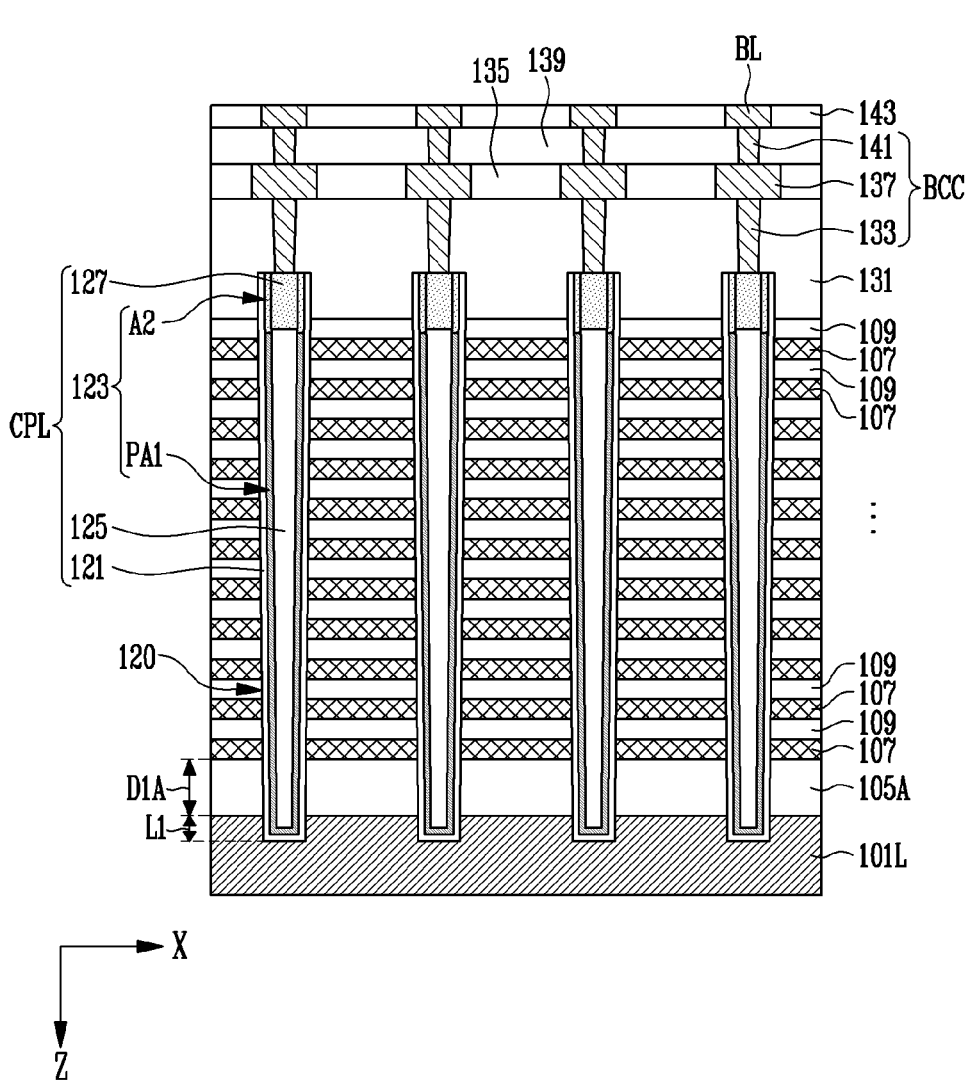
FIGS. 8A, 8B, 8C, and 8D are sectional views illustrating embodiments of step ST11 shown in FIG. 7.
Figure 8B:
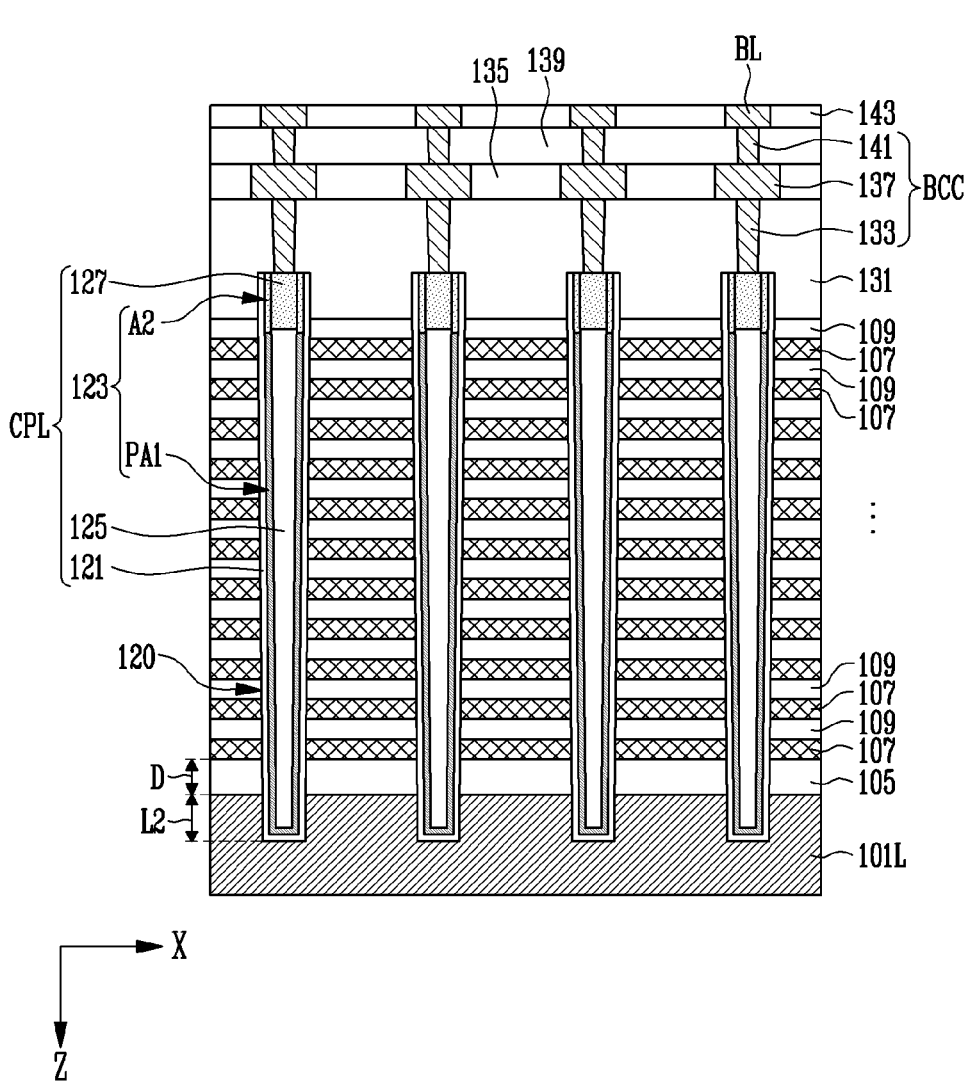
Figure 8C:
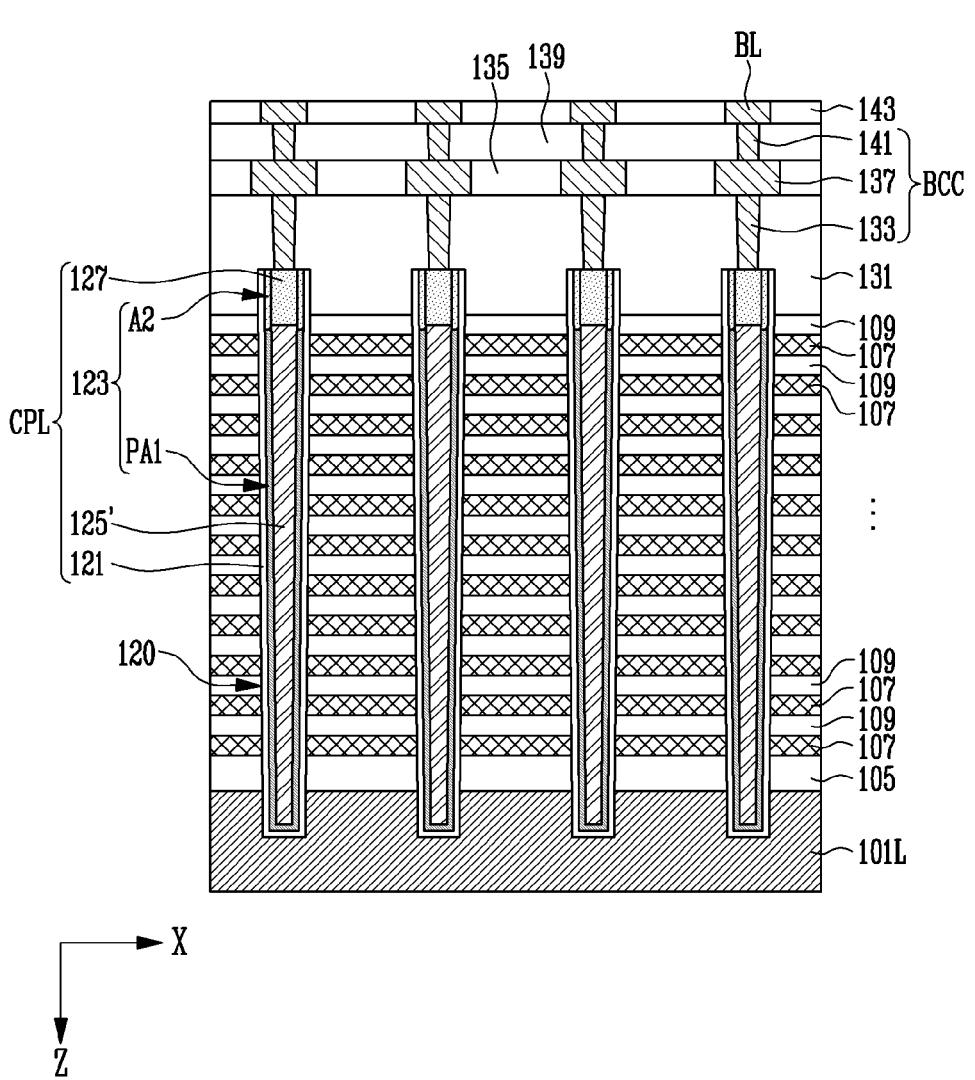
Figure 8D:
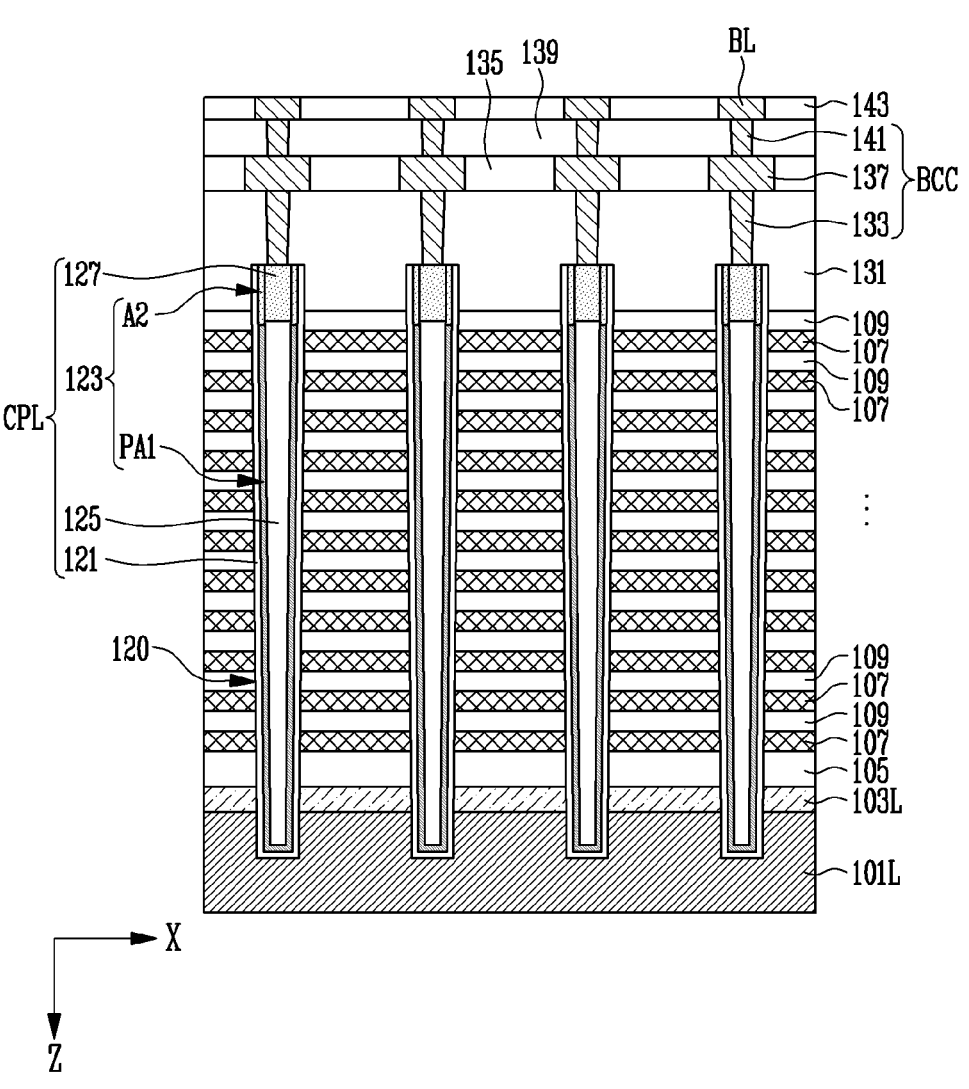

Referring to FIGS. 8A to 8D, the preliminary memory cell array structure formed through the step ST11 may include a base structure. In an embodiment, the base structure may be formed of a semiconductor layer 101L as shown in FIGS. 8A to 8C. In another embodiment, the base structure may be formed of a stack structure of the semiconductor layer 101L and an etch stop layer 103L as shown in FIG. 8D.

The preliminary memory cell array structure may include a first interlayer insulating layer 105A or 105 on the above-described base structure, a plurality of conductive patterns 107 and a plurality of second interlayer insulating layers 109, which are alternately stacked on the first interlayer insulating layer 105A or 105, a cell plug CPL which penetrates the plurality of conductive patterns 107 and the plurality of second interlayer insulating layers 109 and extends to the inside of the base structure, and a bit line BL connected to the cell plug CPL.

The semiconductor layer 101L may include single crystalline silicon. The etch stop layer 103L may be made of a material having an etch selectivity with respect to the semiconductor layer 101L. As shown in FIG. 17B, the semiconductor layer 101L may be selectively removed by using at least one process among a Chemical Mechanical Polishing (CMP) process, a wet etching process, a dry etching process, and a cleansing process in a subsequent process. The etch stop layer 103L may be made of a material having an etching resistance with respect to a material used to perform the CMP process, the wet etching process, the dry etching process, or the cleansing process, which are described above. In an embodiment, the etch stop layer 103L may include at least one of a silicon carbide nitride (SiCN) layer and a silicon nitride (SiN) layer.

The first interlayer insulating layer 105A or 105 may be made of the same material as each second interlayer insulating layer 109. In an embodiment, the first interlayer insulating layer 105A or 105 may include an oxide layer including silicon oxide, etc.

In an embodiment, as shown in FIGS. 8A to 8C, the first interlayer insulating layer 105A or 105 may be in direct contact with the semiconductor layer 101L provided as the base structure. In another embodiment, as shown in FIG. 8D, the first interlayer insulating layer 105 may be formed on the stack structure of the semiconductor layer 101L and the etch stop layer 103L, which are provided as the base structure.

The first interlayer insulating layer 105A or 105 shown in FIGS. 8A to 8D may be formed thicker than the second interlayer insulating layer 109, and have various thicknesses. In an embodiment, as shown in FIG. 8A, a thickness D1A of the first interlayer insulating layer 105A may be greater than a length L1 of an end portion of the cell plug CPL, which is disposed in the base structure (e.g., the semiconductor layer 101L). In another embodiment, as shown in FIG. 8B, a thickness D of the first interlayer insulating layer 105 may be smaller than a length L2 of an end portion of the cell plug CPL, which is disposed in the base structure (e.g., the semiconductor layer 101L). The embodiment of the present disclosure is not limited thereto, and the thickness of the first interlayer insulating layer may be substantially equal to the length of the end portion of the cell plug, which is disposed in the base structure.

The plurality of conductive patterns 107 and the plurality of second interlayer insulating layers 109 may surround the cell plug CPL. The process of forming the plurality of conductive patterns 107 and the plurality of second interlayer insulating layers 109, which surround the cell plug CPL, may include a process of alternately stacking a plurality of first material layers and a plurality of second material layers on the first interlayer insulating layer 105A or 105. In an embodiment, the first material layer may be formed of a conductive material for the conductive pattern 107, and the second material layer may be an insulating material for the second interlayer insulating layer 109. In another embodiment, the first material layer may be a sacrificial material, and the second material layer may be an insulating material for the second interlayer insulating layer 109. More specifically, the sacrificial material may be a nitride layer, and the second interlayer insulating layer 109 may be an oxide layer.

Figure 11A:
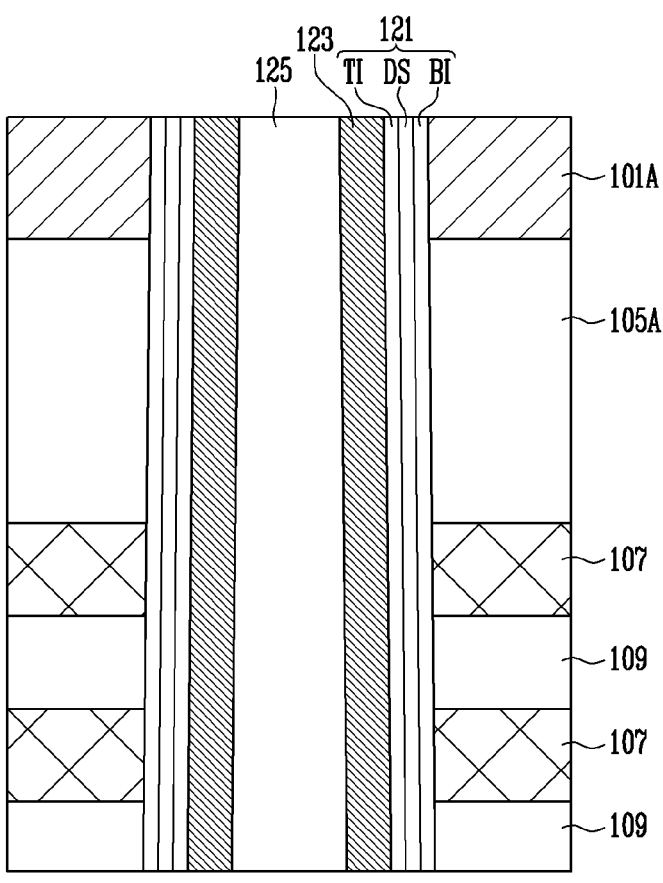
FIGS. 11A, 11B, and 11C are enlarged sectional views of region AR2 shown in FIG. 10, and are sectional views illustrating steps ST33 and ST35 shown in FIG. 7.

The process of forming the plurality of conductive patterns 107 and the plurality of second interlayer insulating layers 109, which surround the cell plug CPL, may include a process of forming a hole 120 penetrating the plurality of first material layers and the plurality of second material layers through an etching process using a mask pattern (not shown) as an etch barrier, a process of forming the cell plug CPL in the hole 120, and a process of removing the mask pattern. The hole 120 and the cell plug CPL may extend to the inside of the semiconductor layer 101L. The process of forming the cell plug CPL may include a process of forming a memory layer 121 on a surface of the hole 120, a process of forming a channel layer 123 on the memory layer 121, and a process of filling a central region of the hole 120 with a core insulating layer 125 or 125' and a capping pattern 127. The memory layer 121 may include a blocking insulating layer BI, a data storage layer DS, and a tunnel insulating layer TI as shown in FIG. 11A. The channel layer 123 may include a semiconductor layer. The core insulating layer 125 or 125' may include an insulating material having an etch selectivity with respect to the memory layer 121. In an embodiment, as shown in FIGS. 8A, 8B, and 8D, the core insulating layer 125 may include oxide of polysilazane (PSZ). In another embodiment, as shown in FIG. 8C, the core insulating layer 125' may include a porous insulating material.

The core insulating layer 125 or 125' may be formed to have a height lower than that of the channel layer 123. The capping pattern 127 may include a doped semiconductor layer as described with reference to FIGS. 3A and 3B, and overlap with the core insulating layer 125 or 125'. A conductivity type impurity in the capping pattern 127 may be diffused into the channel layer 123 from a sidewall of the channel layer 123, which is in contact with the capping pattern 127. Accordingly, the channel layer 123 may be divided into a drain junction A2 adjacent to the capping pattern 127 and a preliminary channel region PA1 under the drain junction A2. The preliminary channel region PA1 may be substantially intrinsic.

Subsequently, a region in which the mask pattern is removed may be filled with a first insulating layer 131. The cell plug CPL may be covered by the first insulating layer 131. When the first material layer and the second material layer, which are described above, are made of the conductive material for the conductive pattern 107 and the insulating material for the second interlayer insulating layer 109, the first material layer and the second material layer may remain as the conductive pattern 107 and the second interlayer insulating layer 109, which surround the cell plug CPL. When the first material layer and the second material layer are made of the sacrificial material and the insulating material for the second interlayer insulating layer 109, a process of replacing the sacrificial material with the conductive pattern 107 may be additionally performed.

The process of forming the bit line BL connected to the cell plug CPL may include a process of forming a bit line-channel connection structure BCC connected to the capping pattern 127 of the cell plug CPL and a process of forming the bit line BL connected to the bit line-channel connection structure BCC. In an embodiment, the process of forming the bit line-channel connection structure BCC may include a process of forming a first conductive plug 133 penetrating the first insulating layer 131, a process of forming a second insulating layer 135 covering the first conductive plug 133 and the first insulating layer 131, a process of forming a conductive pad 137 penetrating the second insulating layer 135, a process of forming a third insulating layer 139 covering the conductive pad 137 and the second insulating layer 135, and a process of forming a second conductive plug 141 penetrating the third insulating layer 139.

The process of forming the bit line BL may include a process of forming a fourth insulating layer 143 covering the second conductive plug 141 and the third insulating layer 139, a process of forming a trench which penetrates the fourth insulating layer 143 and exposes the bit line-channel connection structure BCC, and a process of filling the trench with a conductive material.

Figure 9:
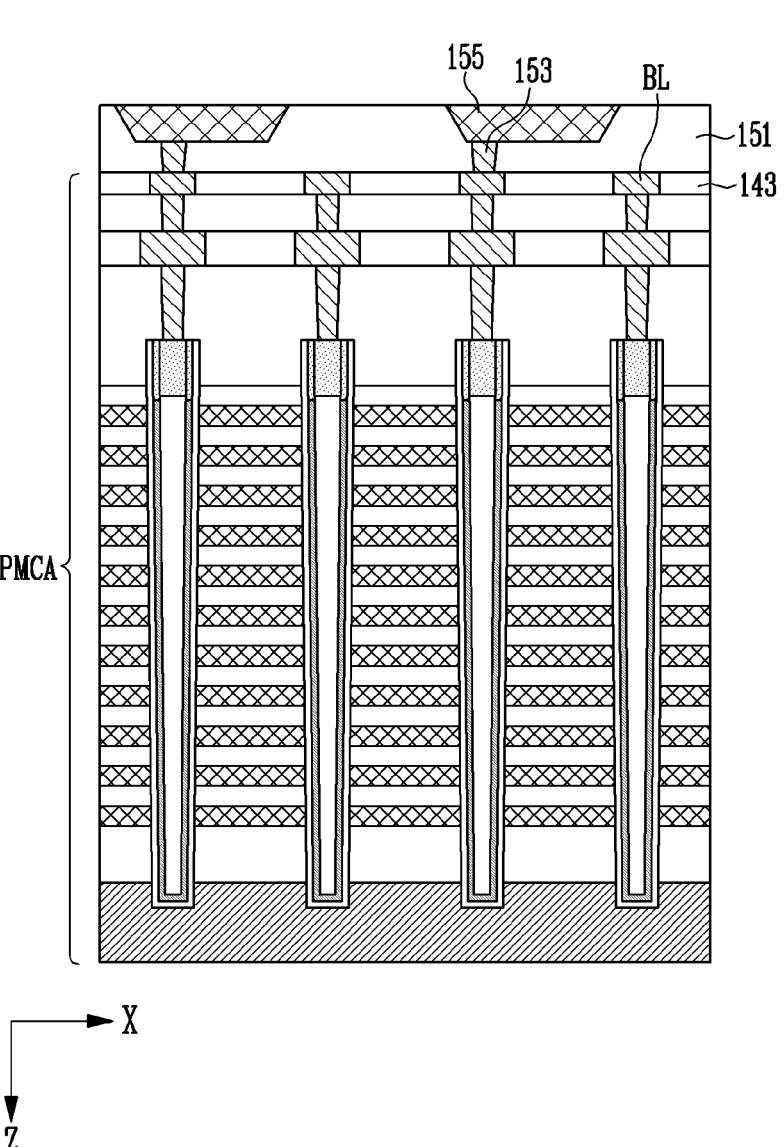
FIG. 9 is a sectional view illustrating steps ST13 and ST15 shown in FIG. 7.

FIG. 9 is a sectional view illustrating the steps ST13 and ST15 shown in FIG. 7.

Referring to FIG. 9, a cell array-side insulating structure 151 over a preliminary memory cell array structure PMCA, and a first interconnection 153 and a first conductive bonding pad 155, which are buried in the cell array-side insulating structure 151, may be formed through the steps ST13 and ST15. The preliminary memory cell array structure PMCA shown in FIG. 9 may be any one of the preliminary memory cell array structures shown in FIGS. 8A to 8D. FIG. 9 illustrates a case where the preliminary memory cell array structure PMCA is configured as the preliminary memory cell array structure shown in FIG. 8A, but the embodiment of the present disclosure is not limited thereto.

Figure 10:
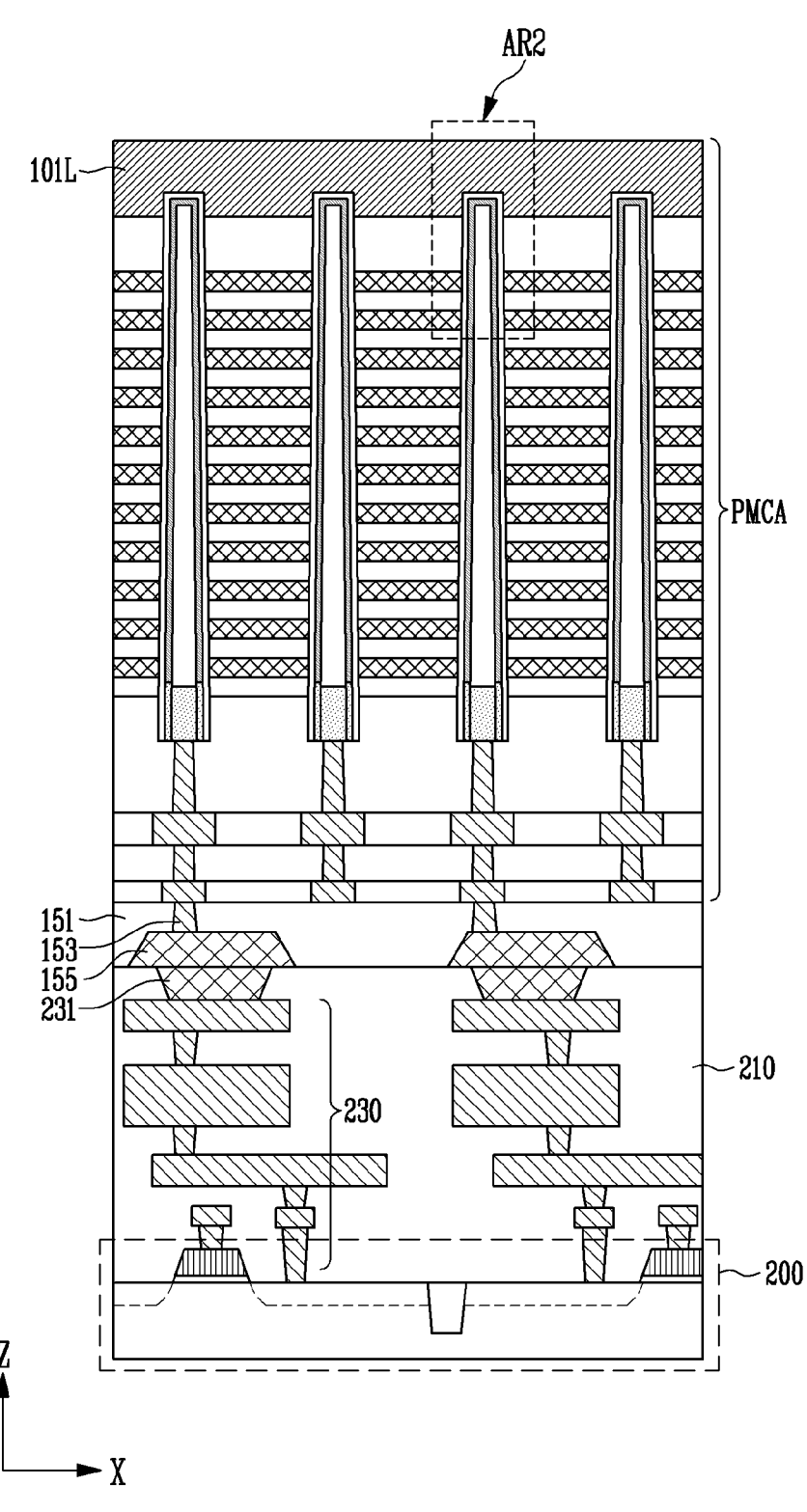
FIG. 10 is a sectional view illustrating steps ST21, ST23, ST25, and ST31 shown in FIG. 7.

FIG. 10 is a sectional view illustrating the steps ST21, ST23, ST25, and ST31 shown in FIG. 7.

Referring to FIG. 10, the peripheral circuit structure 200 described with reference to FIG. 4B may be formed through the step ST21, and a peripheral circuit-side insulating structure 210 covering the peripheral circuit structure 200, and a second interconnection 230 and a second conductive bonding pad 231, which are buried in the peripheral circuit-side insulating structure 210, may be formed through the steps ST23 and ST25.

Subsequently, the first conductive bonding pad 155 having the structure provided through the process described with reference to FIG. 9 may be bonded to the second conductive bonding pad 231 through the step ST31. In addition, the peripheral circuit-side insulating structure 210 may be bonded to the cell array-side insulating structure 151.

Figure 11B:
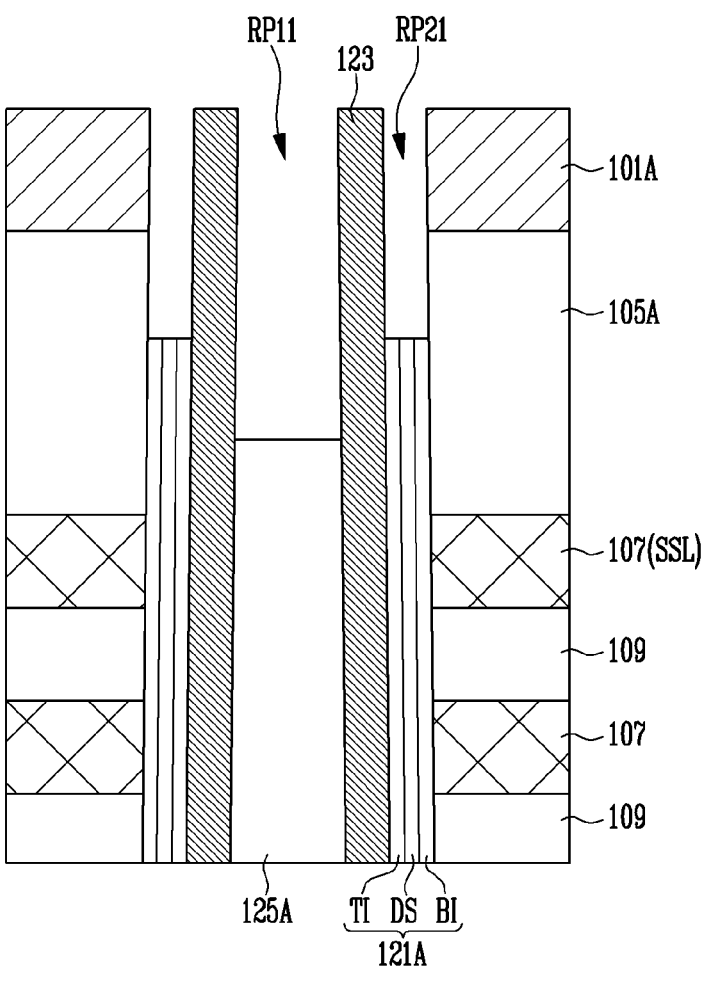
Figure 11C:
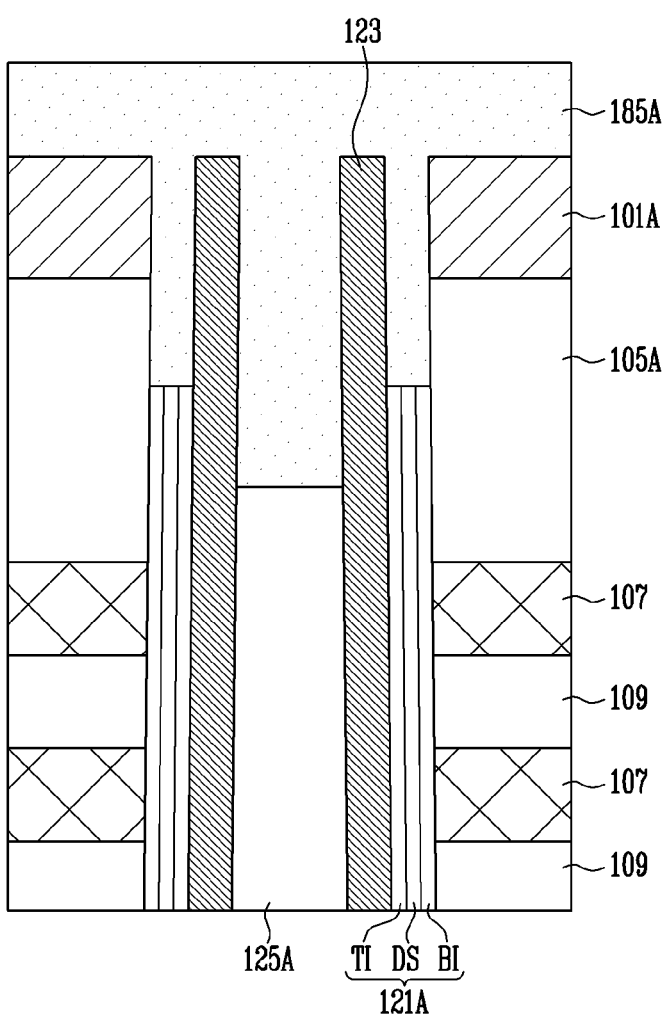

FIGS. 11A to 11C are enlarged sectional views of region AR2 shown in FIG. 10, and are sectional views illustrating the steps ST33 and ST35 shown in FIG. 7. A first interlayer insulating layer 105A, a plurality of conductive patterns 107, a plurality of second interlayer insulating layers 109, a tunnel insulating layer TI, a data storage layer DS, a blocking insulating layer BI, a channel layer 123, and a core insulating layer 125, which are shown in FIGS. 11A to 11C, are portions of the preliminary memory cell array structure shown in FIG. 8A.

Referring to FIG. 11A, a portion of the preliminary memory cell array structure PMCA shown in FIG. 10 may be removed from a back surface of the base structure (e.g., the semiconductor layer 101L) shown in FIG. 10 such that the core insulating layer 125 is exposed through the step ST33. In an embodiment, a portion of the preliminary memory cell array structure PMCA shown in FIG. 10 may be removed through a Chemical Mechanical Polishing (CMP) process.

A portion of the base structure (e.g., the semiconductor layer 101L) shown in FIG. 10 may remain as a spacer pattern 101A. In an embodiment, the spacer pattern 101A may remain thinner than the first interlayer insulating layer 105A. The first interlayer insulating layer 105A may be protected by the spacer pattern 101A.

In addition, the channel layer 123, the blocking insulating layer BI, the data storage layer DS, and the tunnel insulating layer TI may be exposed through the step ST33.

Referring to FIG. 11B, the step ST35 may include step of removing a portion of the core insulating layer 125 shown in FIG. 11A by using at least one process among a wet etching process and a dry etching process. An etching time may be controlled such that a portion of the memory layer 121 is removed. Accordingly, a first recess part RP11 at which a portion of the core insulating layer is removed and a second recess part RP21 at which a portion of the memory layer is removed may be defined. Due to an etching speed difference between the core insulating layer and the memory layer, the first recess part RP11 may be formed deeper than the second recess part RP21. Although not in detail in the drawing, the tunnel insulating layer TI, the data storage layer DS, and the blocking insulating layer BI may remain to have different heights.

Hereinafter, the remaining memory layer may be referred to as a memory pattern 121A, and the remaining core insulating layer may be referred to as a core insulating pattern 125A.

A conductive pattern adjacent to the first interlayer insulating layer 105A among the plurality of conductive patterns 107 may be a source select line SSL. In order to increase a turn-on current of a source select transistor connected to the source select line SSL, the first recess part RP11 may be formed deeper than the second recess part RP21 toward a level at which the source select line SSL is disposed.

During the etching process for forming the first recess part RP11, the time required for the second recess part RP21 to reach the level at which the source select line SSL is disposed may be increased through a portion of the memory layer between the spacer pattern 101A and the channel layer 123, which are shown in FIG. 11A. Accordingly, in accordance with the embodiment of the present disclosure, the etching process may be controlled such that a distance between a bottom surface of the second recess part RP21 and the source select line SSL is secured. In addition, although the spacer pattern 101A remains thinner than the first interlayer insulating layer 105A, the time required for the second recess part RP21 to reach the level at which the source select line SSL is disposed may be increased through a portion of the memory layer between the channel layer 123 and the first interlayer insulating layer 105A formed thicker than the second interlayer insulating layer 109. Thus, in accordance with the embodiment of the present disclosure, the etching process can be controlled such that a phenomenon in which the source select line SSL is exposed through the second recess part RP21 can be prevented or mitigated.

Referring to FIG. 11C, the step ST35 may include step of filling the first recess part RP11 and the second recess part RP21, which are shown in FIG. 11B, with a doped semiconductor layer 185A. In an embodiment, the doped semiconductor layer 185A may include polycrystalline silicon.

After the doped semiconductor layer 185A is formed, an annealing process may be performed such that a conductivity type impurity in the doped semiconductor layer 185A is activated. While the annealing process is performed, a source junction A3 may be defined as shown in FIGS. 3A and 3B. Accordingly, as shown in FIGS. 3A and 3B, a channel pattern 123 including the source junction A3, a channel region A1, and a drain junction A2 may be defined.

Although not shown in the drawing, before the annealing process is performed, a process of injecting a conductivity type impurity into the inside of the doped semiconductor layer 185A and an end portion of the channel layer 123, which is surrounded by the spacer pattern 101A, may be additionally performed.

Figure 12A:
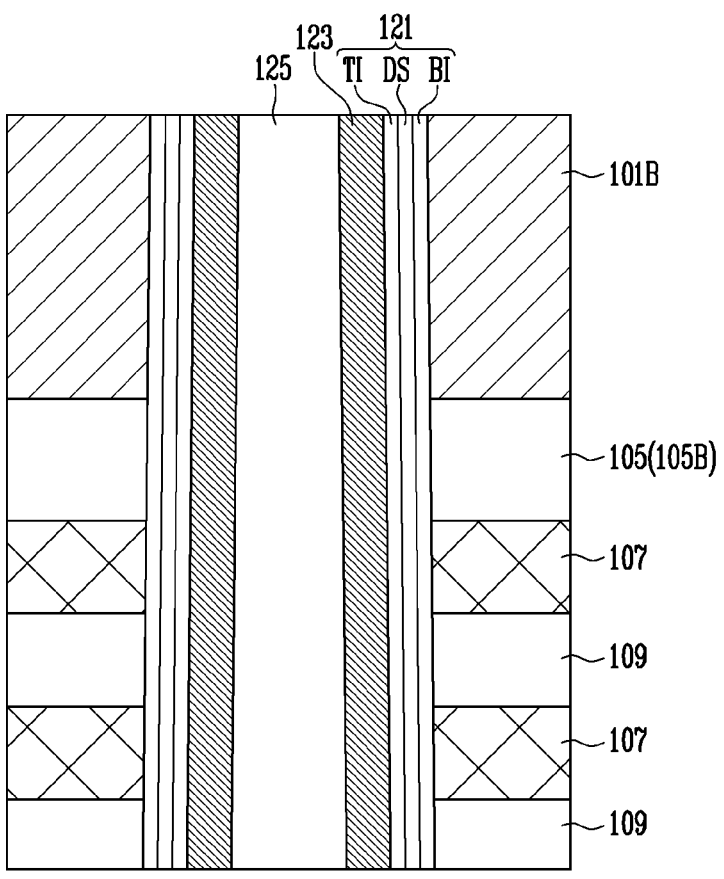
FIGS. 12A and 12B are sectional views illustrating the steps ST33 and ST35 shown in FIG. 7.
Figure 12B:
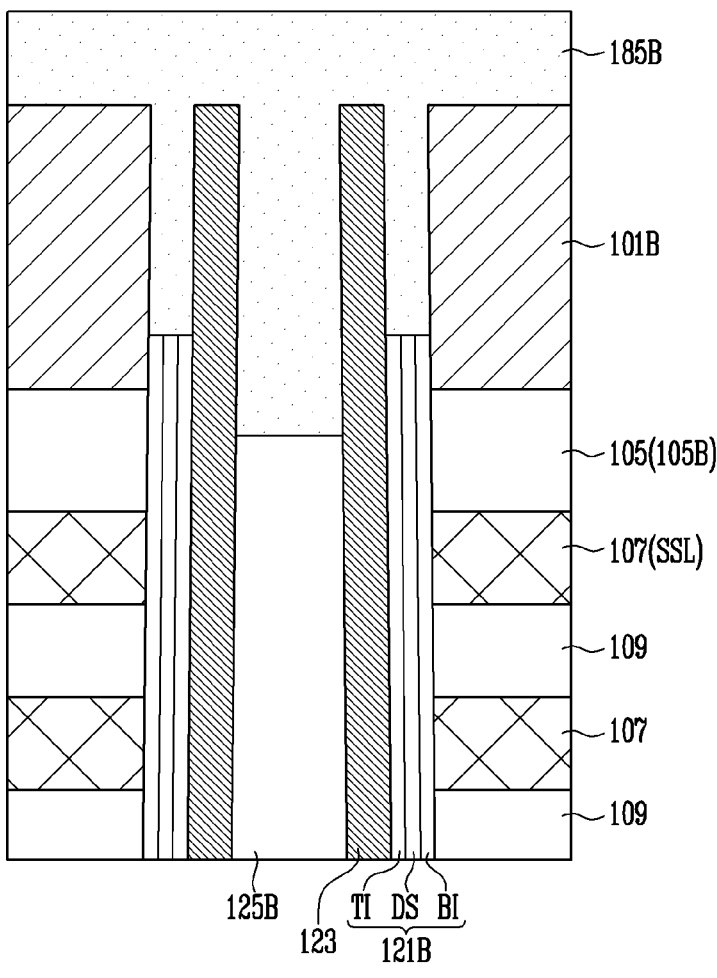

FIGS. 12A and 12B are sectional views illustrating the steps ST33 and ST35 shown in FIG. 7. FIGS. 12A and 12B are enlarged sectional views corresponding to the region AR2 shown in FIG. 10. A first interlayer insulating layer 105, a plurality of conductive patterns 107, a plurality of second interlayer insulating layers 109, a tunnel insulating layer TI, a data storage layer DS, a blocking insulating layer BI, a channel layer 123, and a core insulating layer 125, which are shown in FIGS. 12A and 12B, may be portions of the preliminary memory cell array structure shown in FIG. 8B.

Referring to FIG. 12A, a spacer pattern 101B may be defined by removing a portion of the preliminary memory cell array structure such that the core insulating layer 125 and the memory layer 121 are exposed through the step ST33. In an embodiment, the spacer pattern 101B may be configured as a remaining part of the semiconductor layer 101L shown in FIG. 8B, and remain thicker than the first interlayer insulating layer 105. The first interlayer insulating layer 105 may be protected by the spacer pattern 101B. The first interlayer insulating layer 105 shown in FIG. 12A may correspond to the first interlayer insulating layer 105B shown in FIG. 5A.

Referring to FIG. 12B, a memory pattern 121B and a core insulating pattern 125B may be defined through an etching process of the step ST35. Etched surfaces of a tunnel insulating layer TI, a data storage layer DS, and a blocking insulating layer BI of the memory pattern 121B may have different positions. However, the etched surfaces may be disposed at a level higher than that at which the source select line SSL is disposed. The source select line SSL may be a conductive pattern adjacent to the first interlayer insulating layer 105 among the plurality of conductive patterns 107.

In accordance with the embodiment of the present disclosure, the spacer pattern 101B remains thicker than the first interlayer insulating layer 105B, so that the positions of the etched surfaces of the tunnel insulating layer TI, the data storage layer DS, and the blocking insulating layer BI may be controlled to become a level higher than that at which the source select line SSL is disposed.

Subsequently, as described with reference to FIG. 11C, a doped semiconductor layer 185B may be formed. Subsequently, an annealing process is performed, so that a conductivity type impurity in the doped semiconductor layer 185B may be activated. In addition, the conductivity type impurity in the doped semiconductor layer 185B may be diffused into the channel layer 123. Accordingly, as shown in FIG. 5A, a channel pattern 123B including a source junction A3 and a channel region A1 can be defined.

Figure 13A:
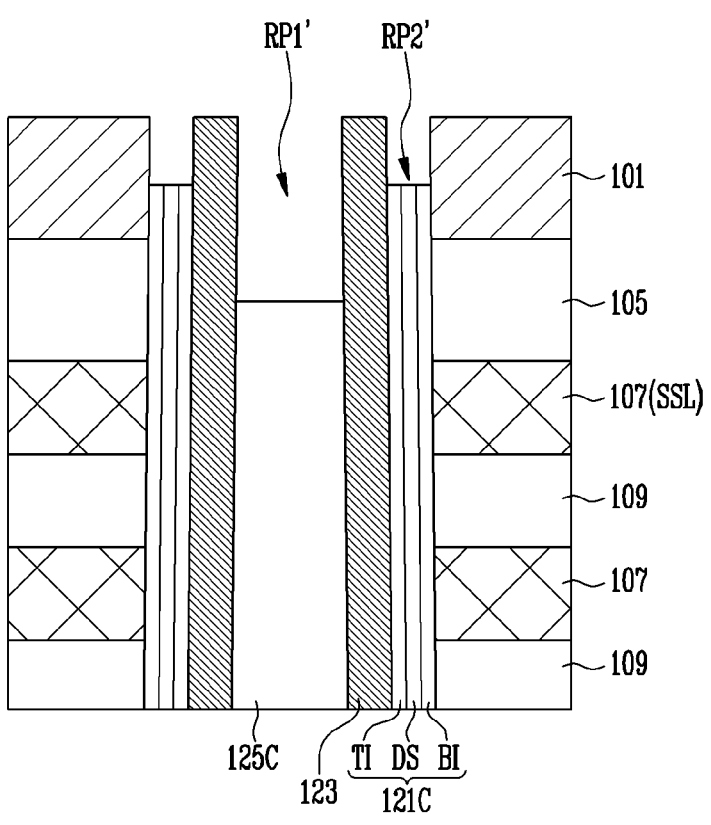
FIGS. 13A and 13B are sectional views illustrating the step ST35 shown in FIG. 7.
Figure 13B:
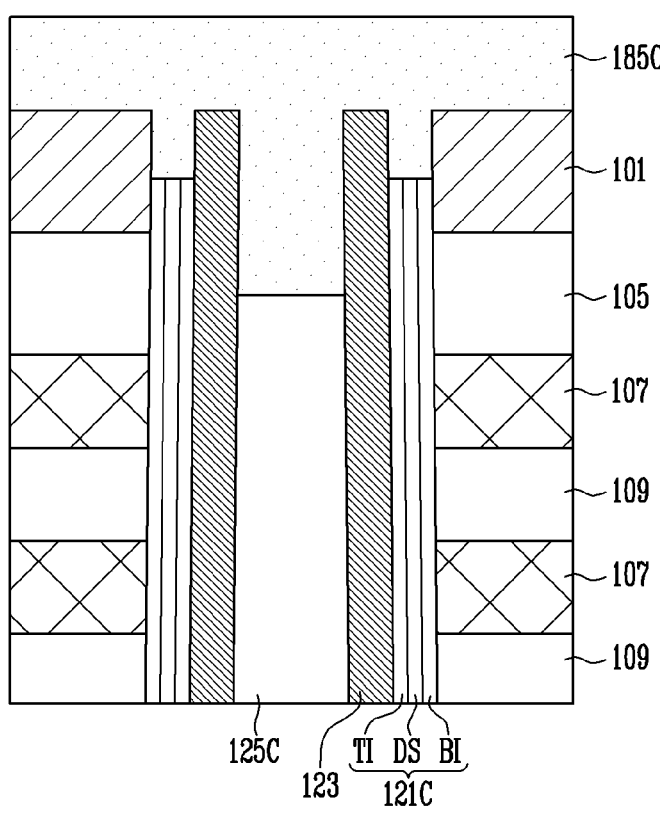

FIGS. 13A and 13B are sectional views illustrating the step ST35 shown in FIG. 7. FIGS. 13A and 13B are enlarged sectional views corresponding to the region AR2 shown in FIG. 10. A first interlayer insulating layer 105, a plurality of conductive patterns 107, a plurality of second interlayer insulating layers 109, a tunnel insulating layer TI, a data storage layer DS, a blocking insulating layer BI, and a channel layer 123, which are shown in FIGS. 13A and 13B, may be portions of the preliminary memory cell array structure shown in FIG. 8B.

Referring to FIG. 13A, a spacer pattern 101 may be formed on the first interlayer insulating layer 105 through the process described with reference to FIG. 12A. The spacer pattern 101 may remain to have a thickness substantially the same as a thickness of the first interlayer insulating layer 105.

Subsequently, a portion of the memory layer and a portion of the core insulating layer may be removed through the etching process of the step ST35 described with reference to FIG. 11B. A first recess part RP1' may be defined in an region in which the portion of the core insulating layer is removed, and the remaining core insulating layer may be defined as a core insulating pattern 125C. A second recess part RP2' may be defined in a region in which the portion of the memory layer is removed, and the remaining memory layer may be defined as a memory pattern 121C. Due to an etching speed difference between the core insulating layer and the memory layer, the first recess part RP1' may be formed deeper than the second recess part RP2'.

A conductive pattern adjacent to the first interlayer insulating layer 105 may be a source select line SSL. The etching time of the step ST35 is controlled, so that a bottom surface of the second recess part RP2' may be located closer to a level at which the spacer pattern 101 is disposed than a level at which the source select line SSL is disposed. Accordingly, in an embodiment, a phenomenon in which the source select line SSL is exposed through the second recess part RP2' may be prevented or mitigated.

Referring to FIG. 13B, as described with reference to FIG. 11C, the first recess part RP1' and the second recess part RP2', which are shown in FIG. 13A, may be filled with a doped semiconductor layer 185C through the step ST35. Subsequently, an annealing process of activating a conductivity type impurity in the doped semiconductor layer 185C and diffusing the conductivity type impurity into the channel layer 123 may be performed. Accordingly, as shown in FIG. 5B, a channel pattern 123C including a source junction A3 may be defined.

Although not shown in the drawing, as another embodiment of the etching process of the step ST35, the etching time of the step ST35 can be controlled such that loss hardly occurs in the memory layer. Accordingly, as shown in FIG. 5C, the memory pattern 121D and the spacer pattern 101 may substantially remain on the same line.

Figure 14A:
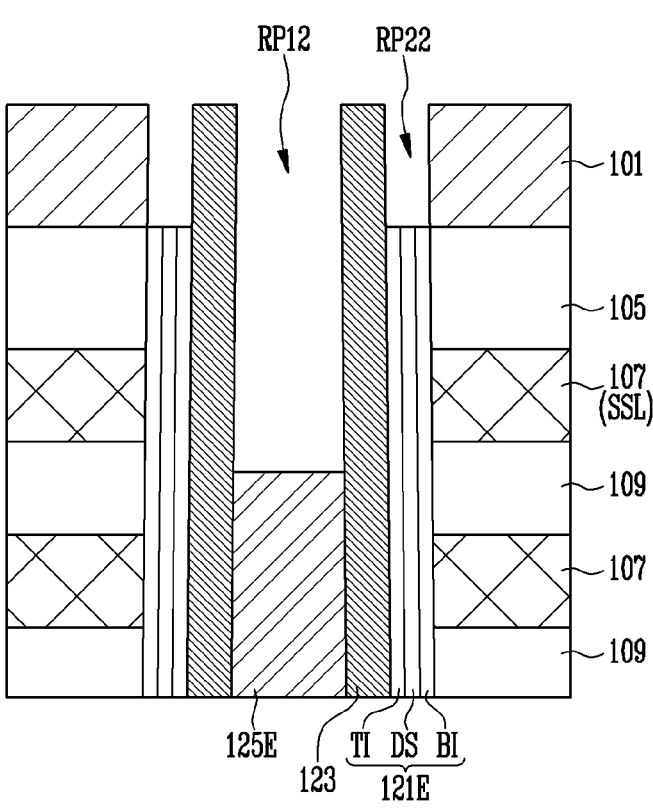
FIGS. 14A and 14B are sectional views illustrating the step ST35 shown in FIG. 7.
Figure 14B:
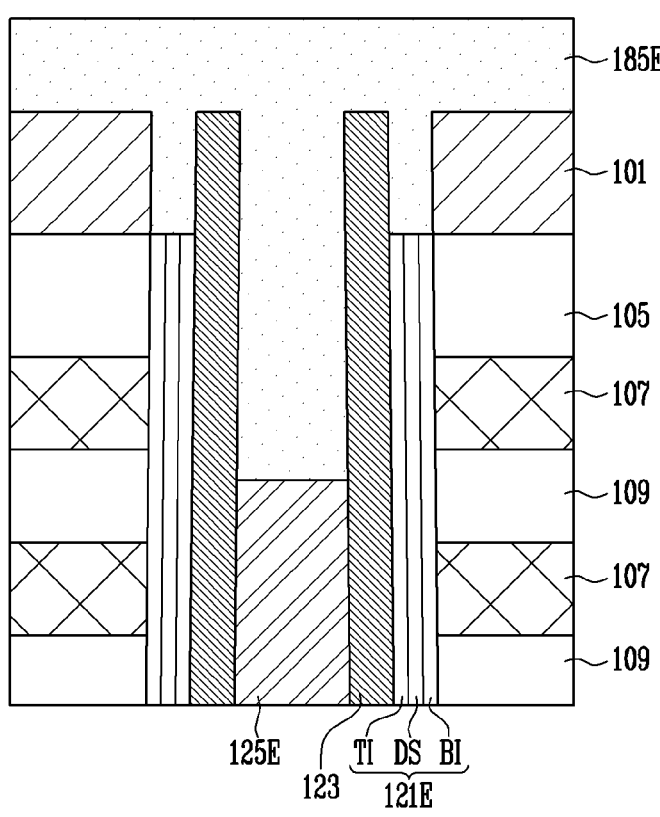

FIGS. 14A and 14B are sectional views illustrating the step ST35 shown in FIG. 7. FIGS. 14A and 14B are enlarged sectional views corresponding to the region AR2 shown in FIG. 10. A first interlayer insulating layer 105, a plurality of conductive patterns 107, a plurality of second interlayer insulating layers 109, a tunnel insulating layer TI, a data storage layer DS, a blocking insulating layer BI, and a channel layer 123, which are shown in FIGS. 14A and 14B, may be portions of the preliminary memory cell array structure shown in FIG. 8C.

Referring to FIG. 14A, a spacer pattern 101 may be formed on the first interlayer insulating layer 105 through the process described with reference to FIG. 12A. The thickness of the spacer pattern 101 may be variously controlled.

Subsequently, a portion of the memory layer and a portion of the core insulating layer may be removed through an etching process of the step ST35 described with reference to FIG. 11B. A first recess part RP12 may be defined in a region in which the portion of the core insulating layer is removed, and the remaining core insulating layer may be defined as a core insulting pattern 125E. A second recess part RP22 may be defined in a region in which the portion of the memory layer is removed, and the remaining memory layer may be defined as a memory pattern 121E. Due to an etching speed difference between the core insulating layer and the memory layer, the first recess part RP12 may be formed deeper than the second recess part RP22. In an embodiment, a bottom surface of the first recess part RP12 may be disposed at a level lower than that at which a source select line SSL is disposed. The source select line SSL may be a conductive pattern adjacent to the first interlayer insulating layer 105 among the plurality of conductive patterns 107.

Referring to FIG. 14B, as described with reference to FIG. 11C, the first recess part RP12 and the second recess part RP22, which are shown in FIG. 14A, may be filled with a doped semiconductor layer 185E through the step ST35. Subsequently, an annealing process of activating a conductivity type impurity in the doped semiconductor layer 185E and diffusing the conductivity type impurity into the channel layer 123 may be performed. Accordingly, as shown in FIG. 5D, a channel pattern 123E including a source junction A3 may be defined.

Figure 15A:
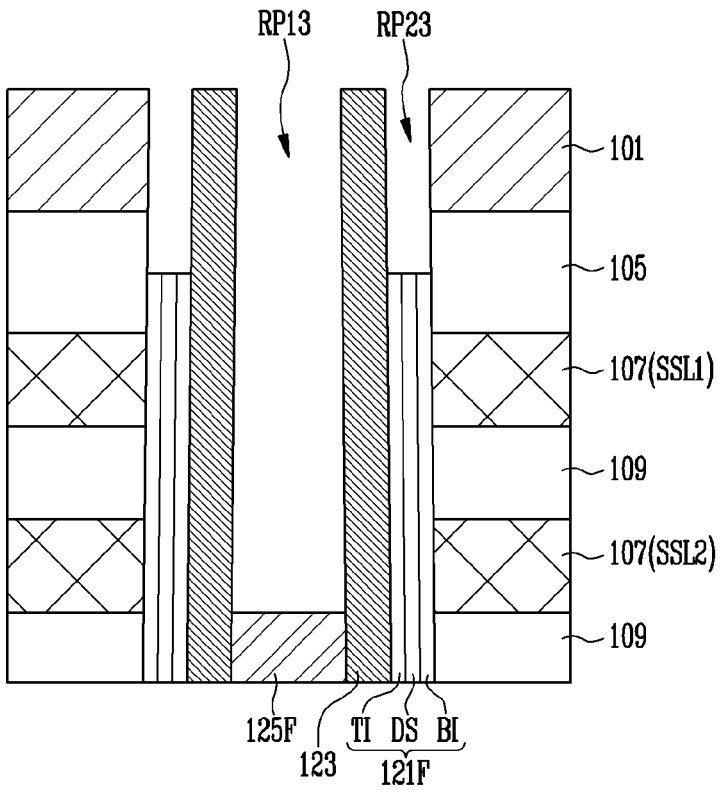
FIGS. 15A and 15B are sectional views illustrating the step ST35 shown in FIG. 7.
Figure 15B:
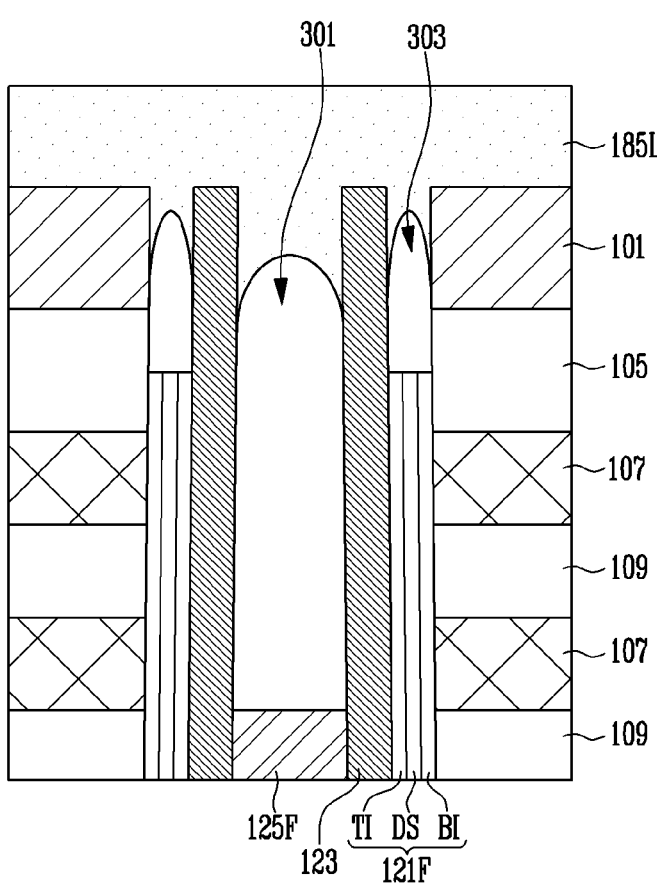

FIGS. 15A and 15B are sectional views illustrating the step ST35 shown in FIG. 7. FIGS. 15A and 15B are enlarged sectional views corresponding to the region AR2 shown in FIG. 10. A first interlayer insulating layer 105, a plurality of conductive patterns 107, a plurality of second interlayer insulating layers 109, a tunnel insulating layer TI, a data storage layer DS, a blocking insulating layer BI, and a channel layer 123, which are shown in FIGS. 15A and 15B, may be portions of the preliminary memory cell array structure shown in FIG. 8C.

Referring to FIG. 15A, a spacer pattern 101 may be formed on the first interlayer insulating layer 105 through the process described with reference to FIG. 12A. The thickness of the spacer pattern 101 may be variously controlled.

Subsequently, a portion of the memory layer and a portion of the core insulating layer may be removed through the etching process of the step ST35 described with reference to FIG. 11B. A first recess part RP13 may be defined in a region in which the portion of the core insulating layer is removed, and the remaining core insulating layer may be defined as a core insulating pattern 125F. A second recess part RP23 may be defined in a region in which the portion of the memory layer is removed, and the remaining memory layer may be defined as a memory pattern 121F. Due to an etching speed difference between the core insulating layer and the memory layer, the first recess part RP13 may be formed deeper than the second recess part RP23. In an embodiment, the first recess part RP13 may overlap with at least two conductive patterns adjacent to the first interlayer insulating layer 105 among the plurality of conductive patterns 107. The at least two conductive patterns may be used as source select lines SSL1 and SSL2.

Referring to FIG. 15B, the step ST35 may include step of depositing a preliminary doped semiconductor layer 185L on the spacer pattern 101. When the preliminary doped semiconductor layer 185L is deposited through a deposition process having a low step coverage, the first recess part RP13 and the second recess part RP23, which are shown in FIG. 15A, are not completely filled with the preliminary doped semiconductor layer 185L, and voids 301 and 303 may be defined in the preliminary doped semiconductor layer 185L.

Figure 16:
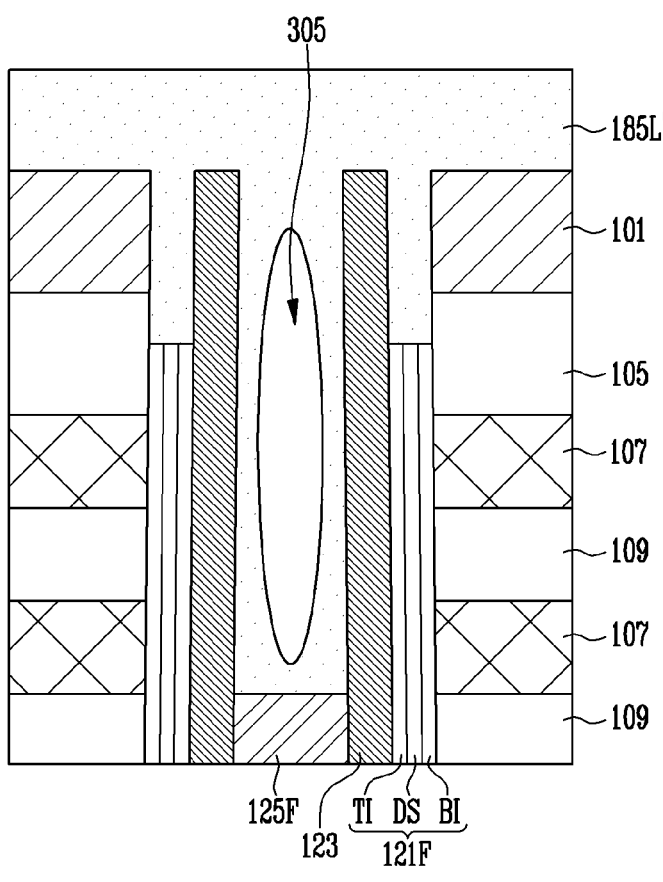
FIG. 16 is a sectional view illustrating step of depositing a preliminary doped semiconductor layer.

FIG. 16 is a sectional view illustrating step of depositing a preliminary doped semiconductor layer. FIG. 16 illustrates a spacer pattern 101, a first interlayer insulating layer 105, a plurality of conductive patterns 107, a plurality of second interlayer insulating layers 109, a tunnel insulating layer TI, a data storage layer DS, and a blocking insulating layer BI of a memory pattern 121F, and a channel layer 123, which are the same as shown in FIG. 15A.

Referring to FIG. 16, after the etching process of the step ST35 shown in FIG. 15A is performed, a preliminary doped semiconductor layer 185L' may be formed as described with reference to FIG. 15B. When the preliminary doped semiconductor layer 185L' is formed through a deposition process having a high step coverage, the second recess part RP23 shown in FIG. 15A may be filled with the preliminary doped semiconductor layer 185L'. Because the first recess part RP13 shown in FIG. 15A has a relatively high aspect ratio, the first recess part RP13 is not completely filled with the preliminary doped semiconductor layer 185L', and a seam 305 may remain in the preliminary doped semiconductor layer 185L'.

The step ST35 may include steps of melting and recrystalizing of the preliminary doped semiconductor layer 185L or 185L' through an annealing process. Accordingly, the voids 301 and 303 shown in FIG. 15B or the seam 305 shown in FIG. 16 may be removed, and a surface of the preliminary doped semiconductor layer 185L or 185L' may be planarized.

Through melting and recrystallization through the above-described annealing process, a doped semiconductor layer 185F including a core pattern 185CP and a sidewall pattern 185SP may be formed as shown in FIG. 5E. During the annealing process, a conductivity type impurity in the doped semiconductor layer 185F may be activated, and be diffused into the channel layer 123 shown in FIG. 15B or 16. Accordingly, a channel pattern 123F including a source junction A3 may be defined as shown in FIG. 5E.

FIGS. 17A to 17E are sectional views illustrating the steps ST33 and ST35 shown in FIG. 7. FIGS. 17A to 17E are enlarged sectional views corresponding to the region AR2 shown in FIG. 10.

Figure 17A:
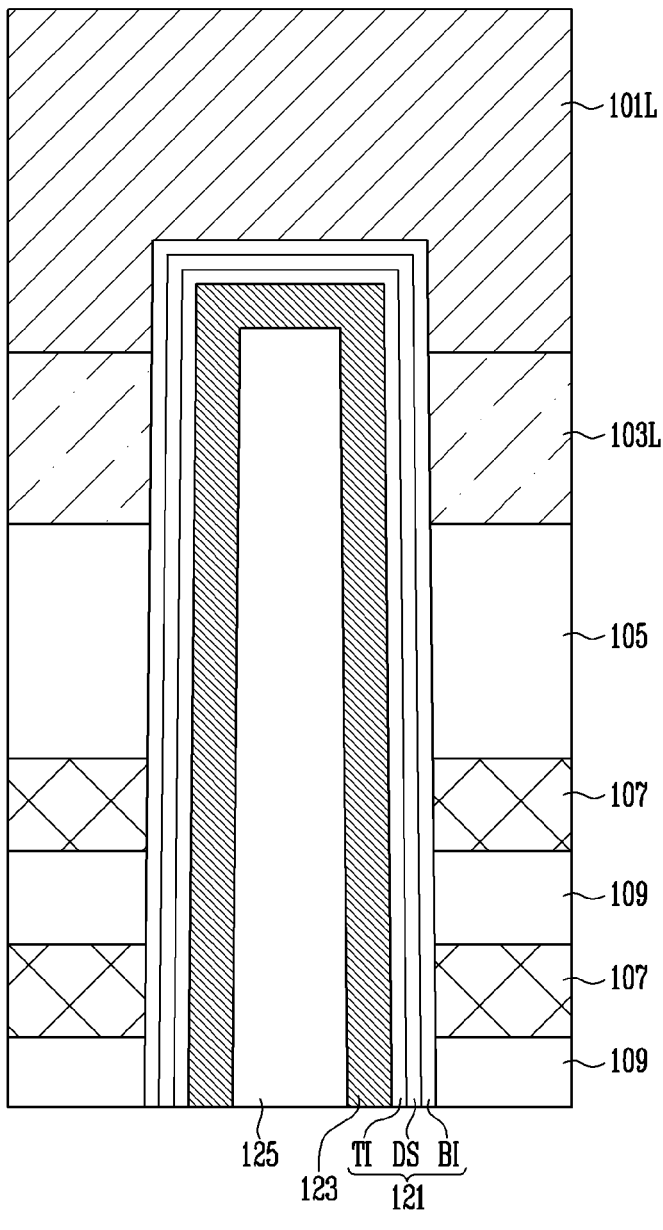
FIGS. 17A, 17B, 17C, 17D, and 17E are sectional views illustrating the steps ST33 and ST35 shown in FIG. 7.
Figure 17B:
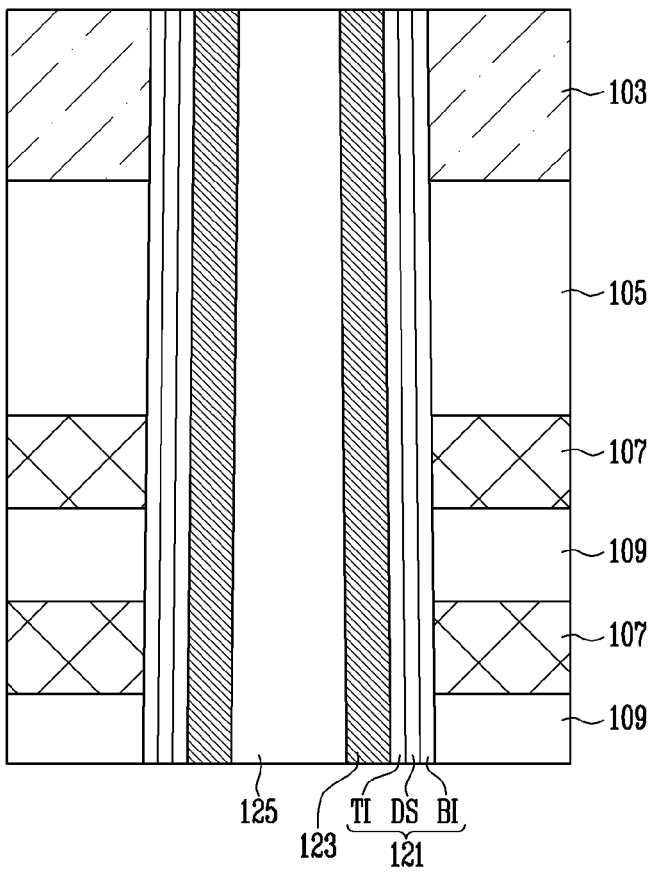

Referring to FIG. 17A, a semiconductor layer 101L, an etch stop layer 103L, a first interlayer insulating layer 105, a plurality of conductive patterns 107, a plurality of second interlayer insulating layers 109, a tunnel insulating layer TI, a data storage layer DS, a blocking insulating layer BI, and a channel layer 123 may be portions of the preliminary memory cell array structure shown in FIG. 8D.

Referring to FIG. 17B, a portion of the preliminary memory cell array structure may be removed such that a core insulating layer 125 and a memory layer 121 are exposed through the step ST33 described with reference to FIG. 11A. The semiconductor layer 101L shown in FIG. 17A may be removed. The etch stop layer 103L shown in FIG. 17A may have a high etch selectivity with respect to the semiconductor layer 101L, as compared as the first interlayer insulating layer 105.

The first interlayer insulating layer 105 may be protected by the etch stop layer 103L while the semiconductor layer 101L is removed. After the step ST33, the remaining etch stop layer 103L may be defined as a spacer pattern 103.

Figure 17C:
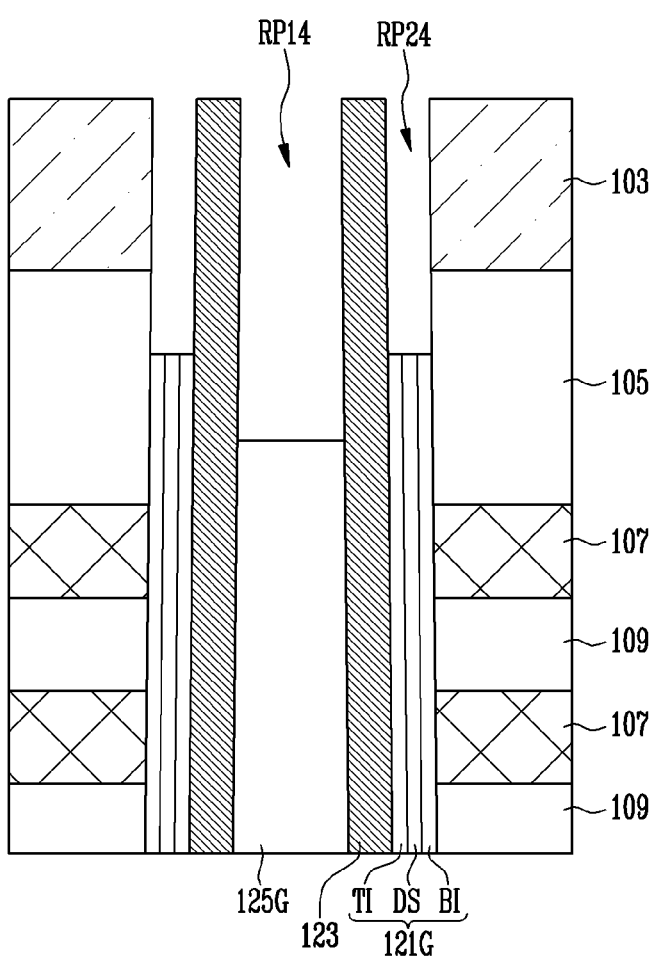

Referring to FIG. 17C, a portion of the memory layer and a portion of the core insulating layer may be removed through the etching process of the step ST35 described with reference to FIG. 11B. A first recess part RP14 may be defined in a region in which the portion of the core insulating layer is removed, and the remaining core insulating layer may be defined as a core insulating pattern 125G. A second recess part RP24 may be defined in a region in which the portion of the memory layer is removed, and the remaining memory layer may be defined as a memory pattern 121G. Due to an etching speed difference between the core insulating layer and the memory layer, the first recess part RP14 may be formed deeper than the second recess part RP24.

Figure 17D:
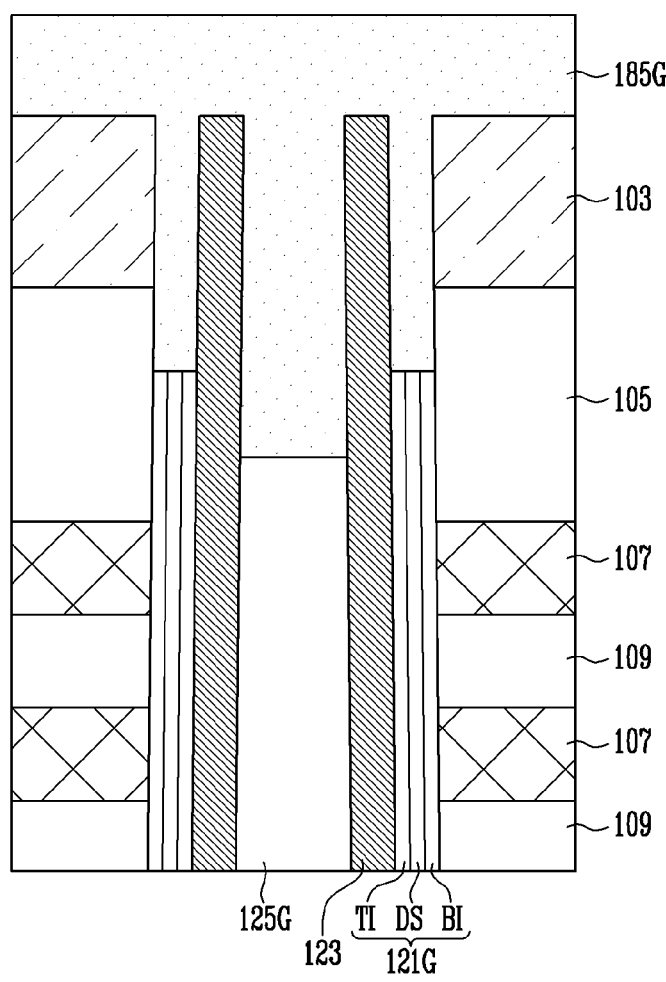

Referring to FIG. 17D, the step ST35 may include step of filling the first recess part RP14 and the second recess part RP24, which are shown in FIG. 17C, with a doped semiconductor layer 185G.

Figure 17E:
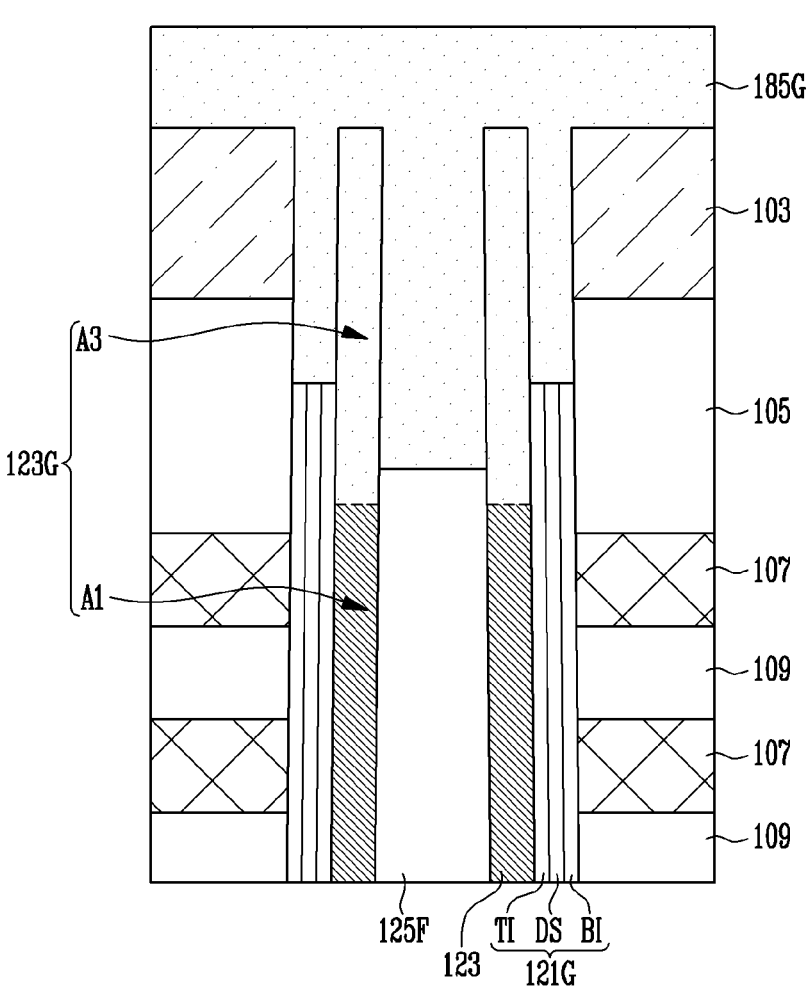

Referring to FIG. 17E, after the step ST35, an annealing process may be performed such that a conductivity impurity in the doped semiconductor layer 185G is activated. While the annealing process is performed, the impurity in the doped semiconductor layer 185G is diffused into the channel layer 123 shown in FIG. 17D. Therefore, a source junction A3 may be defined, and a channel region A1 which is substantially intrinsic may remain. Accordingly, the channel pattern 123G described with reference to FIG. 6 may be formed.

FIGS. 18A to 18D are sectional views illustrating the steps ST33 and ST35 shown in FIG. 7.

Before processes shown in FIG. 18A to 18D are performed, a preliminary memory cell array structure including the semiconductor layer 101L, the first interlayer insulating layer 105A or 105, the plurality of conductive patterns 107 and the plurality of second interlayer insulating layers 109, the cell plug CPL, and the bit line BL, which are shown in FIGS. 8A to 8C, may be formed through the step ST11 shown in FIG. 7. Hereinafter, subsequent processes will be described based on the structure shown in FIG. 8A, but the embodiment of the present disclosure is not limited thereto.

After the preliminary memory cell array is formed, the cell array-side insulating structure 151, the first interconnection 153, and the first conductive bonding pad 155, which are shown in FIG. 9, may be formed through the steps ST13 and ST15 shown in FIG. 7. Subsequently, as shown in FIG. 10, the first conductive bonding pad 155 may be bonded to the second conductive bonding pad 231, and the cell array-side insulating structure 151 may be bonded to the peripheral circuit-side insulating structure 210. The second conductive bonding pad 231 may be connected to the peripheral circuit structure 200 via the second interconnection 230 buried in the peripheral circuit-side insulating structure 210. The peripheral circuit structure 200, the second interconnection 230, and the second conductive bonding pattern 231, which are shown in FIG. 10 may be provided through the steps ST21, ST23, and ST25 shown in FIG. 7.

FIGS. 18A to 18D may correspond to the region AR2 shown in FIG. 10.

Figure 18A:
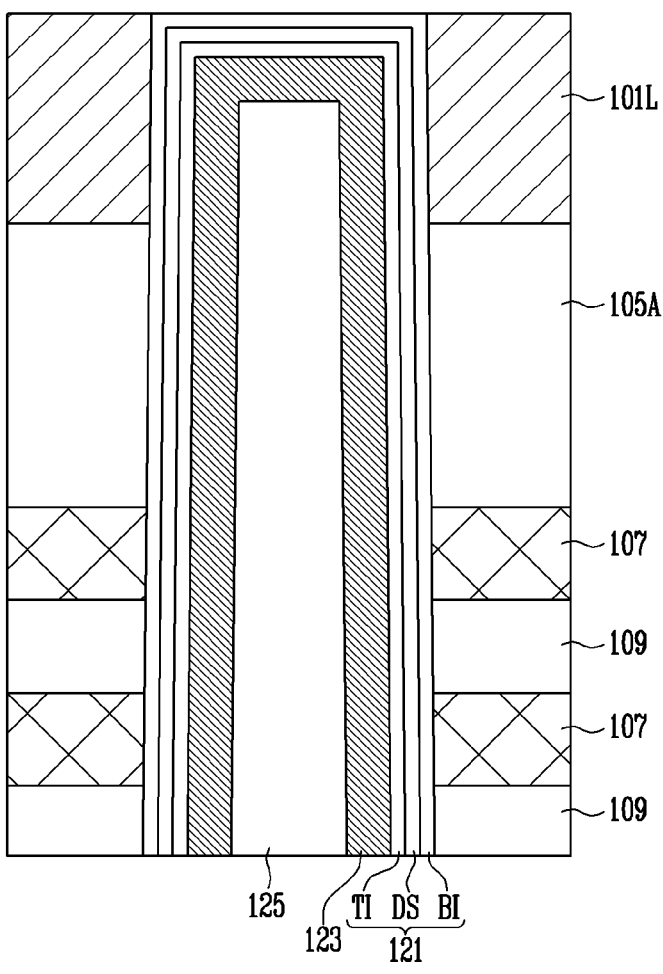
FIGS. 18A, 18B, 18C, and 18D are sectional views illustrating the steps ST33 and ST35 shown in FIG. 7.

Referring to FIG. 18A, a portion of the semiconductor layer 101L may be removed from a back surface of the semiconductor layer 101L such that the memory layer 121 is exposed through the step ST33. In an embodiment, a portion of the semiconductor layer 101L shown in FIG. 10 may be removed through a Chemical Mechanical Polishing (CMP) process. The first interlayer insulating layer 105A may be protected by the remaining semiconductor layer 101L.

The channel layer 123 may be protected by the memory layer 121. In an embodiment, each of the blocking insulating layer BI, the data storage layer DS, and the tunnel insulating layer TI of the memory layer 121 may protect the channel layer 123.

Subsequently, the step ST35 shown in FIG. 7 may be performed. The step ST35 may include a process of removing a portion of the memory layer 121, a process of injecting a conductivity type impurity into the semiconductor layer 101L and the channel layer 123, and a process of melting and crystalizing portions of the semiconductor layer 101L and the channel layer 123.

Figure 18B:
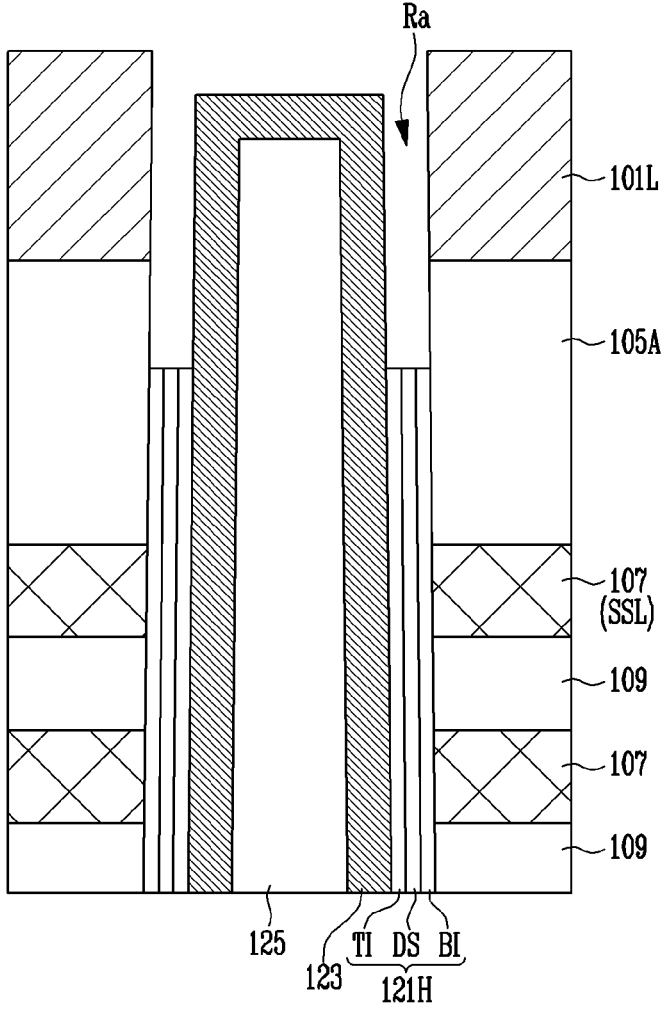

Referring to FIG. 18B, a recess part Ra may be defined between the semiconductor layer 101L and the channel layer 123 by removing a portion of the memory layer 121 shown in FIG. 18A in the step ST35. A portion of each of the blocking insulating layer BI, the data storage layer DS, and the tunnel insulating layer TI may be removed by using at least one of wet etching and dry etching, and the channel layer 123 may be exposed. Hereinafter, the remaining memory layer is referred to as a memory pattern 121H.

A conductive pattern adjacent to the first interlayer insulating layer 105A among the plurality of conductive patterns 107 may be a source select line SSL. An etching amount of the memory layer may be controlled to increase a turn-on current of a source select transistor connected to the source select line SSL. A depth of the recess part Ra may be increased in proportion to the etching amount of the memory layer. During an etching process for forming the recess part Ra, a time for which a bottom surface of the recess part Ra reaches a level at which the source select line SSL is disposed may be increased by the remaining semiconductor layer 101L, as compared with a case where the semiconductor layer 101L is completely removed. Accordingly, in accordance with the embodiment of the present disclosure, control may be promoted by the etching amount of the memory layer such that a distance between the bottom surface of the recess part Ra and the source select line SSL is secured.

The etching process for forming the recess part Ra may be performed in a state in which the core insulating layer 125 is blocked by the channel layer 123. Accordingly, the core insulating layer 125 may be protected from the etching process.

Figure 18C:
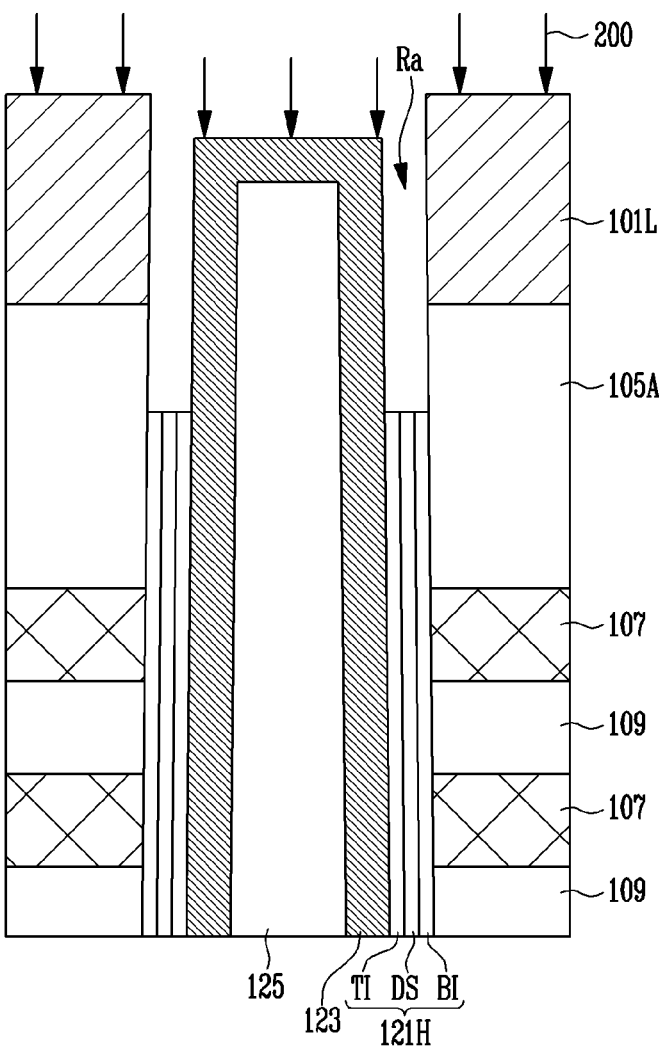

Referring to FIG. 18C, a conductivity type impurity 200 may be injected into the semiconductor layer 101L and the channel layer 123 in the step ST35. The conductivity type impurity 200 may include at least one of an n-type impurity and a p-type impurity.

Figure 18D:
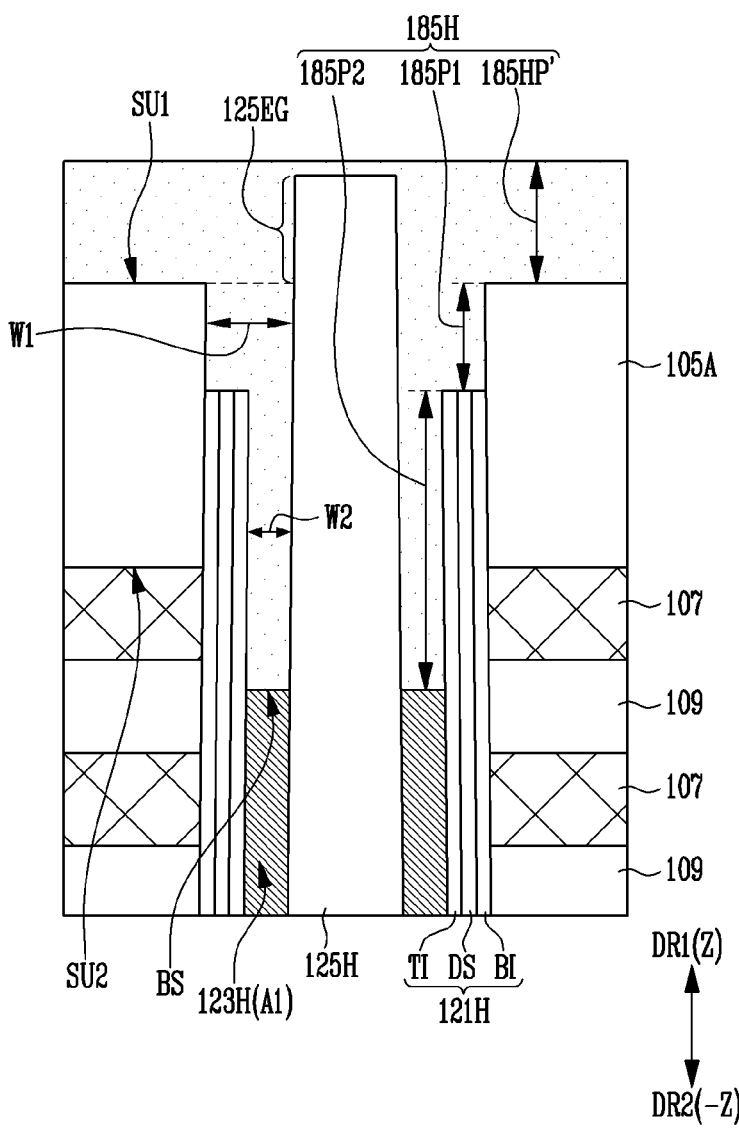

Referring to FIG. 18D, a portion of the channel layer 123 shown in FIG. 18C and the semiconductor layer 101L may be melted in the step ST35. This may be performed through laser annealing. The portion of the channel layer 123 and the semiconductor layer 101 may be melted by irradiating a laser onto the portion of the channel layer 123 and the semiconductor layer 101L. Therefore, a melted semiconductor material may be generated. The recess part Ra shown in FIG. 18C may be filled with the melted semiconductor material. A melted region may be changed in the channel layer 123 shown in FIG. 18C according to an energy density of the laser. For example, the melted region in the channel layer 123 shown in FIG. 18C may increase as the energy density of the laser increases.

The conductivity type impurity may be activated, while the portion of the channel layer 123 shown in FIG. 18C and the semiconductor layer 101L are melted in the step ST35.

Subsequently, a doped semiconductor layer 185H may be formed by crystallizing the melted semiconductor material. The doped semiconductor layer 185H may include the activated conductivity type impurity. A partial region of the channel layer is not melted but may remain as a channel pattern 123H. The channel pattern 123H may include the channel region A1 described with reference to FIGS. 3A and 3B.

Hereinafter, the core insulating layer surrounded by the doped semiconductor layer 185H is referred to as a core insulating pattern 125H.

According to the manufacturing process described with reference to FIGS. 18A to 18D, a memory cell array may include a stack structure including the first interlayer insulating layer 105A, the plurality of conductive patterns 107, and the plurality of second interlayer insulating layers 109, the core insulating pattern 125H penetrating the stack structure, the channel pattern 123H disposed between the core insulating pattern 125H and the stack structure, the memory pattern 121H between the channel pattern 123H and the stack structure, and the doped semiconductor layer 185H connected to the channel pattern 123H.

The first interlayer insulating layer 105A may include a first surface SU1 facing in a first direction DR1 and a second surface SU2 facing in a second direction DR2 opposite to the first direction DR1. In an embodiment, the first direction DR1 and the second direction DR2 may respectively correspond to a positive direction and a negative direction of a Z axis. The plurality of conductive patterns 107 and the plurality of second interlayer insulating layers 109 may be alternately disposed in the second direction DR2 on the second surface SU2 of the first interlayer insulating layer 105A.

The core insulating pattern 125H may include an end portion 125EG further protruding in the first direction DR1 than the first interlayer insulating layer 105A. The memory pattern 121H may further protrude in the first direction DR1 than the channel pattern 123H, and be spaced apart from the core insulating pattern 125H between the first interlayer insulating layer 105A and the core insulating pattern 125H.

The doped semiconductor layer 185H may be disposed on the first surface SU1 of the first interlayer insulating layer 105A, and extend between the core insulating pattern 125H and the memory pattern 121H. In an embodiment, the doped semiconductor layer 185H may be divided into a horizontal pattern 185HP, a first protrusion part 185P1, and a second protrusion part 185P2. The horizontal pattern 185HP' may surround the end portion 125EG of the core insulating pattern 125H. The first protrusion part 185P1 may extend along a sidewall of the first interlayer insulating layer 105A from the horizontal pattern 185HP'. The first protrusion part 185P1 may be mounted on one surface of the memory pattern 121H, which faces in the first direction DR1. The first protrusion part 185P1 may be disposed between the sidewall of the first interlayer insulating layer 105A and a sidewall of the core insulating pattern 125H, and form a coplanar surface with the sidewall of the first interlayer insulating layer 105A and the sidewall of the core insulating pattern 125H. The second protrusion part 185P2 may extend along a sidewall of the memory pattern 121H from the first protrusion part 185P1. The second protrusion part 185P2 may be disposed between the sidewall of the memory pattern 121H and the sidewall of the core insulating pattern 125H, and form a coplanar surface with the sidewall of the memory pattern 121H and the sidewall of the core insulating pattern 125H. The second protrusion part 185P2 may be formed to have a second width W2 narrower than a first width W1 of the first protrusion part 185P1. The second protrusion part 185P2 may be used as a source junction.

The doped semiconductor layer 185H is formed by the melting through the laser annealing and the crystallization, a crystal grain of the doped semiconductor layer 185H may be grown toward the melted semiconductor material by using, as a seed, the channel pattern 123H which is not melted. Accordingly, the doped semiconductor layer 185H may include a crystallization region extending between the memory pattern 121H and the core insulating pattern 125H from the channel pattern 123H.

Figure 19:
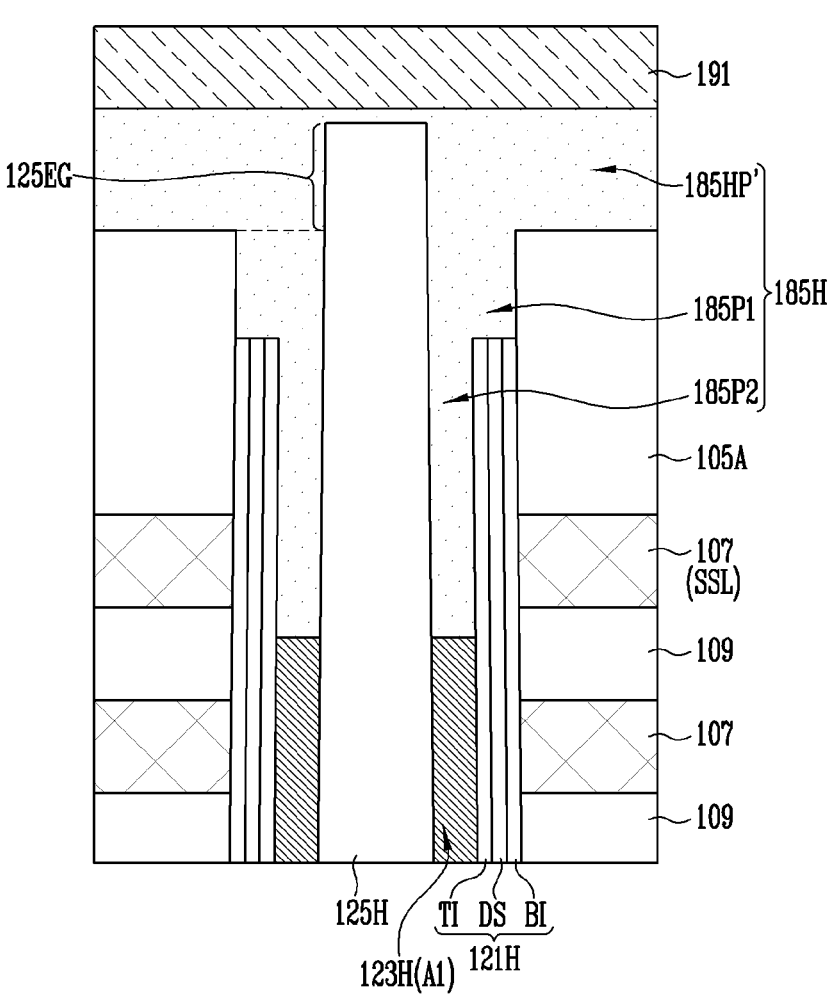
FIG. 19 is a sectional view illustrating a process of forming a metal layer.

FIG. 19 is a sectional view illustrating a process of forming a metal layer.

Referring to FIG. 19, after the step ST35 shown in FIG. 7 is performed, a metal layer 191 may be formed on the doped semiconductor layer 185H. In an embodiment, the process of forming the metal layer 191 may be performed after the process shown in FIG. 18D. The metal layer 191 may extend to cover the end portion 125EG of the core insulating pattern 125H and the horizontal pattern 185HP' of the doped semiconductor layer 185H. The doped semiconductor layer 185H may extend between the metal layer 191 and the end portion 125EG of the core insulating pattern 125H.

Figure 20A:
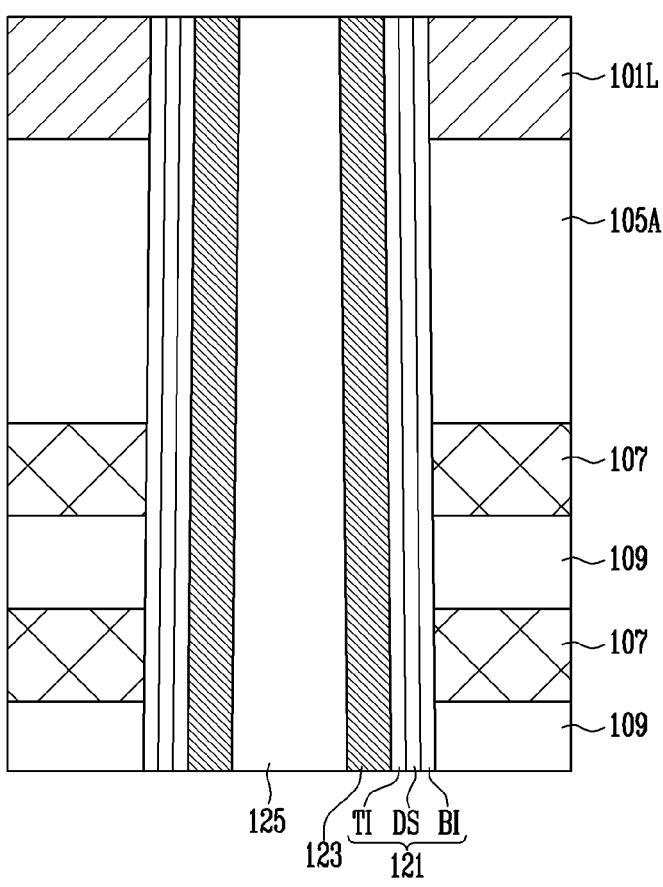
FIGS. 20A, 20B, and 20C are sectional views illustrating the steps ST33 and ST35 shown in FIG. 7.
Figure 20B:
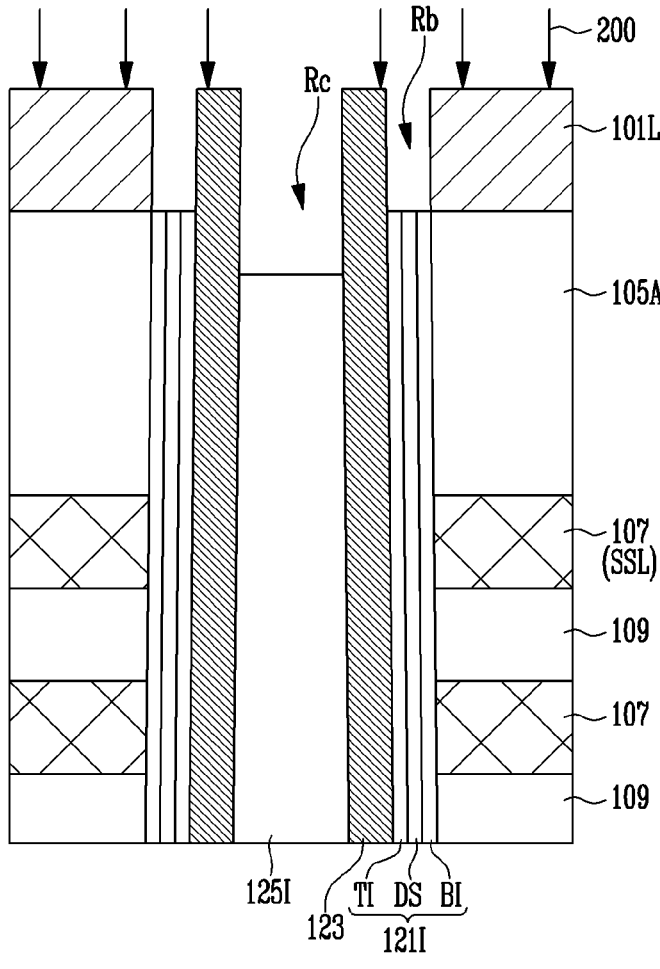
Figure 20C:
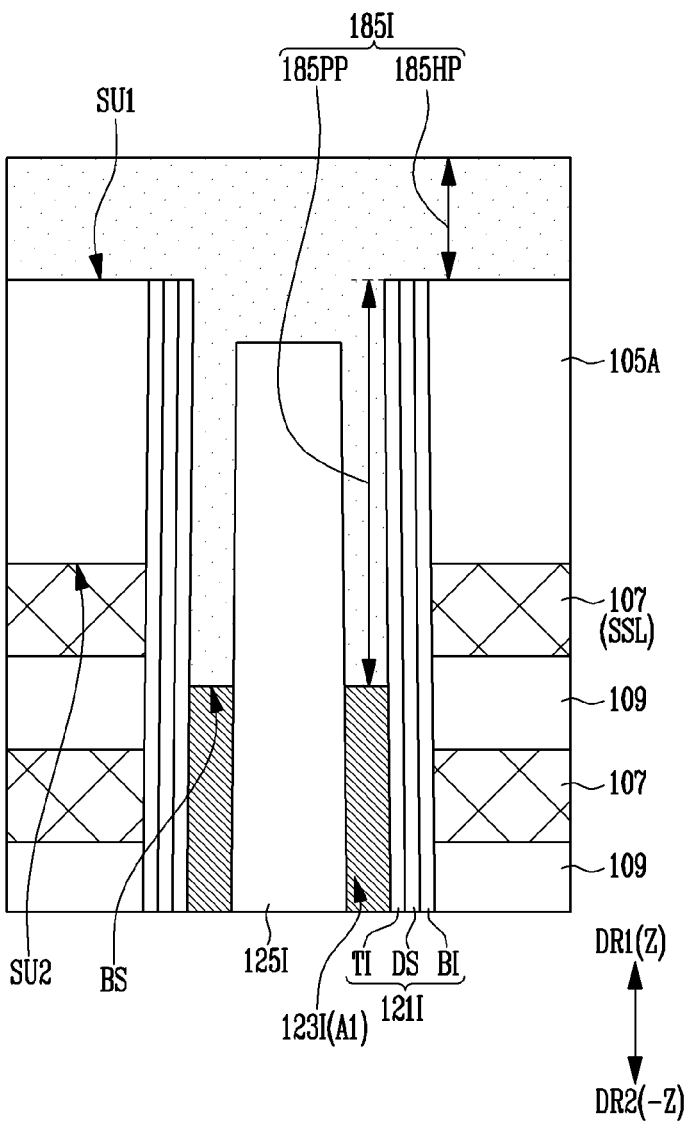

FIGS. 20A to 20C are sectional views illustrating the steps ST33 and ST35 shown in FIG. 7.

Before processes shown in FIGS. 20A to 20C are performed. The preliminary memory cell array structure PMCA shown in FIG. 10 may include one of the structures described with reference to FIGS. 8A to 8C. Hereinafter, subsequent processes will be described based on the structure shown in FIG. 8A, but the embodiment of the present disclosure is not limited thereto.

FIGS. 20A to 20C may correspond to the region AR2 shown in FIG. 10.

Referring to FIG. 20A, through the previously performed processes, a preliminary memory cell array structure may be provided, which includes the base structure configured with the semiconductor layer 101L, the first interlayer insulating layer 105A, the plurality of conductive patterns 107 and the plurality of second interlayer insulating layers 109, the memory layer 121, the channel layer 123, and the core insulating layer 125.

Each of the tunnel insulating layer TI, the data storage layer DS, and the blocking insulating layer BI of the memory layer 121 may be exposed through the step ST33. To this end, a portion of the semiconductor layer 101L may be removed from a back surface of the semiconductor layer 101L. In an embodiment, a portion of the semiconductor layer 101L shown in FIG. 10 may be removed through a Chemical Mechanical Polishing (CMP) process. The first interlayer insulating layer 105A may be protected by the remaining semiconductor layer 101L. A portion of the channel layer 123 may be removed such that the core insulating layer 125 in addition to the memory layer 121 is exposed in the step ST33.

Subsequently, the step ST35 may be performed, which includes a process of removing a portion of the memory layer 121, a process of injecting a conductivity type impurity into the semiconductor layer 101L and the channel layer 123, and a process of melting and crystallizing portions of the semiconductor layer 101L and the channel layer 123.

Referring to FIG. 20B, a first recess part Rb may be defined by removing a portion of the memory layer 121 shown in FIG. 20A in the step S35. The first recess part Rb may be defined between the semiconductor layer 101L and the channel layer 123. While the portion of the memory layer 121 shown in FIG. 20A is removed, a second recess part Rc may be defined as a portion of the core insulating layer 125 exposed as shown in FIG. 20A is removed. Depths of the first recess part Rb and the second recess part Rc may be variously controlled according to an etch selectivity difference between the memory layer 121 and the core insulating layer 125, which are shown in FIG. 20A.

Hereinafter, the remaining memory layer is referred to as a memory pattern 121I, and the remaining core insulating layer is referred to as a core insulating pattern 125I.

A conductive pattern adjacent to the first interlayer insulating layer 105A among the plurality of conductive patterns 107 may be a source select line SSL. The depths of the first recess part Rb and the second recess part Rc may be controlled to fit a turn-on current design value of a source select transistor connected to the source select line SSL. During an etching process for forming the recess part Rb, a time for which a bottom surface of the recess part Rb reaches a level at which the source select line SSL is disposed may be increased by the remaining semiconductor layer 101L, as compared with a case where the semiconductor layer 101L does not remain.

A conductivity type impurity 200 may be injected into the semiconductor layer 101L and the channel layer 123 in the step ST35. The conductivity type impurity 200 may include at least one of an n-type impurity and a p-type impurity.

Referring to FIG. 20C, a portion of the channel layer 123 shown in FIG. 20B and the semiconductor layer 101L may be melted. This may be performed through laser annealing. A melted semiconductor material may fill the first recess part Rb and the second recess part Rc, which are shown in FIG. 20B, by irradiating a laser onto the portion of the channel layer 123 and the semiconductor layer 101L.

Subsequently, a doped semiconductor layer 185I may be formed by crystallizing the melted semiconductor material. The doped semiconductor layer 185I may include the conductivity material activated by the laser annealing. A partial region of the channel layer is not melted but may remain as a channel pattern 123I. The channel pattern 123I may include the channel region A1 described with reference to FIGS. 3A and 3B.

According to the manufacturing process described with reference to FIGS. 20A to 20C, a memory cell array may include a stack structure including the first interlayer insulating layer 105A, the plurality of conductive patterns 107, and the plurality of second interlayer insulating layers 109, the core insulating pattern 125I penetrating the stack structure, the channel pattern 123I disposed between the core insulating pattern 125I and the stack structure, the memory pattern 121I between the channel pattern 123I and the stack structure, and the doped semiconductor layer 185I connected to the channel pattern 123I.

The first interlayer insulating layer 105A may include a first surface SU1 facing in the first direction DR1 and a second surface SU2 facing in the second direction DR2 opposite to the first direction DR1 as described with reference to FIG. 18D. The plurality of conductive patterns 107 and the plurality of second interlayer insulating layers 109 may be alternately disposed in the second direction DR2 on the second surface SU2 of the first interlayer insulating layer 105A.

The first surface SU1 of the first interlayer insulating layer 105A may remain in a state in which the first surface SU1 of the first interlayer insulating layer 105A further protrudes in the first direction DR1 than the core insulating pattern 125I. The memory pattern 121I may further protrude in the first direction DR1 than the channel pattern 123I.

The doped semiconductor layer 185I may be disposed on the first surface SU1 of the first interlayer insulating layer 105A, and extend between the core insulating pattern 125I and the memory pattern 121I. In an embodiment, the doped semiconductor layer 185I may be divided into a horizontal pattern 185HP and a protrusion part 185PP. The horizontal pattern 185HP may extend to cover the first interlayer insulating layer 105A, the core insulating pattern 125I and the memory pattern 121I. The protrusion part 185PP may be disposed between a sidewall of the memory pattern 121I and a sidewall of the core insulating pattern 125I from the horizontal pattern 185HP. The protrusion part 185PP may form a coplanar surface with the sidewall of the memory pattern 121I and the sidewall of the core insulating pattern 125I.

Because the doped semiconductor layer 185I is formed by the melting through the laser annealing and the crystallization, the doped semiconductor layer 185I may include a grain grown between the memory pattern 121I and the core insulating pattern 125I from a boundary surface BS between the protrusion part 185PP and the channel pattern 123I.

As described above, a portion of the preliminary memory cell array structure is etched from the back surface of the base structure including the semiconductor layer, so that the channel layer buried in the base structure may be exposed. Accordingly, the doped semiconductor layer may be to be in contact with the channel layer in the base structure.

In accordance with various embodiments of the present disclosure, the conductivity type impurity is diffused into the exposed channel layer, or the conductivity type impurity is injected into the exposed channel layer and is melted and crystallized, so that a junction may be defined.

In accordance with various embodiments of the present disclosure, the etching amount of at least one of the core insulating layer and the memory layer is controlled, so that the separation distance between the junction and the conductive pattern can be controlled.

In accordance with various embodiments of the present disclosure, a uniform recess part may be provided by using the etch selectivity between the channel layer and at least one of the core insulating layer and the memory layer, so that the uniformity of the junction may be improved.

In accordance with various embodiments of the present disclosure, the formation range of the junction may be quantitatively controlled, so that the reliability of an erase operation using a gate induced drain leakage (GIDL) current determined by the formation range of the junction may be improved.

Figures 21, 22:
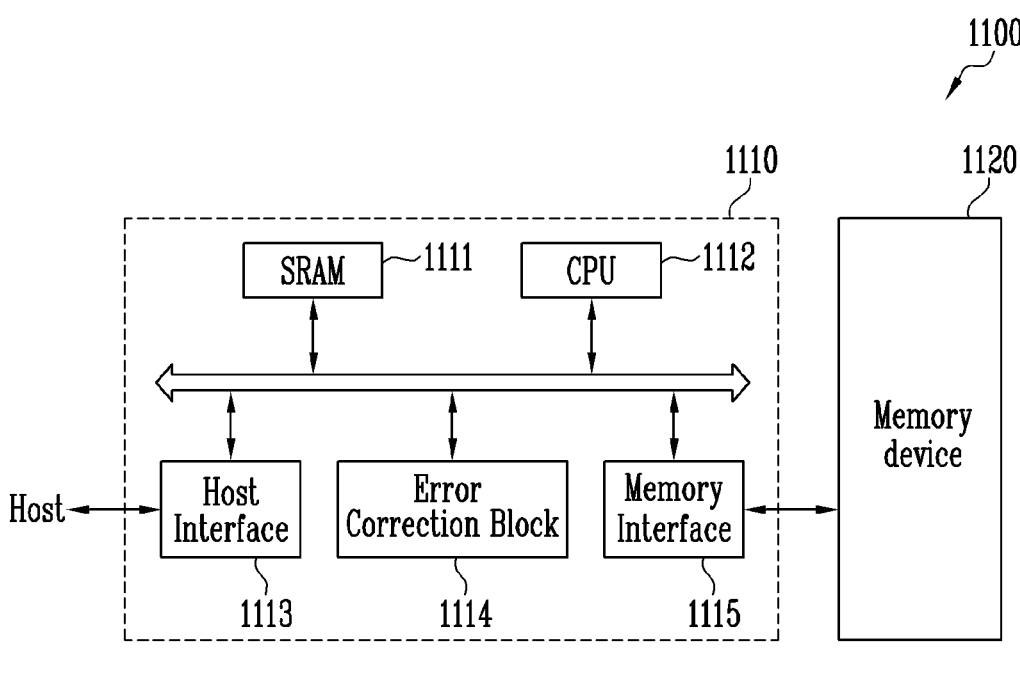
FIG. 21 is a block diagram illustrating a configuration of a memory system in accordance with an embodiment of the present disclosure.
FIG. 22 is a block diagram illustrating a configuration of a computing system in accordance with an embodiment of the present disclosure.

FIG. 21 is a block diagram illustrating a configuration of a memory system in accordance with an embodiment of the present disclosure.

Referring to FIG. 21, the memory system 1100 includes a memory device 1120 and a memory controller 1110.

The memory device 1120 may be a multi-chip package configured with a plurality of flash memory chips. The memory device 1120 may include: a stack structure including a first interlayer insulating layer, and a plurality of second interlayer insulating layers and a plurality of conductive patterns, which are alternately disposed under the first interlayer insulating layer; a hole penetrating the stack structure; a core insulating pattern, a memory pattern, and a channel pattern, disposed inside the hole; and a doped semiconductor layer disposed over the first interlayer insulating layer, the doped semiconductor layer extending to the inside of the hole.

The memory controller 1110 controls the memory device 1120, and may include Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in a data read from the memory device 1120, and corrects the detected error. The memory interface 1115 interfaces with the memory device 1120. The memory controller 1110 may further include Read Only Memory (ROM) for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

FIG. 22 is a block diagram illustrating a configuration of a computing system in accordance with an embodiment of the present disclosure.

Referring to FIG. 22, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211.

The memory device 1212 may include: a stack structure including a first interlayer insulating layer, and a plurality of second interlayer insulating layers and a plurality of conductive patterns, which are alternately disposed under the first interlayer insulating layer; a hole penetrating the stack structure; a core insulating pattern, a memory pattern, and a channel pattern, disposed inside the hole; and a doped semiconductor layer disposed over the first interlayer insulating layer, the doped semiconductor layer extending to the inside of the hole.

The memory controller 1211 may be configured the same as the memory controller 1110 described above with reference to FIG. 21.

In accordance with various embodiments of the present disclosure, a separation distance between a doped semiconductor layer and a conductive pattern of a gate stack structure is secured, so that a leakage current may be reduced. Accordingly, according to various embodiments of the present disclosure, the operational reliability of the semiconductor memory device may be improved.

What is claimed is:

1. A semiconductor memory device comprising:
a plurality of second interlayer insulating layers and a plurality of conductive patterns, alternately disposed under a first interlayer insulating layer;
a doped semiconductor layer over the first interlayer insulating layer;

a spacer pattern between a bottom surface of the doped semiconductor layer and a top surface of the first interlayer insulating layer, the bottom surface facing the plurality of conductive patterns, the top surface facing in an opposite direction to a direction in which the top surface faces;

a hole penetrating the spacer pattern, the first interlayer insulating layer, the plurality of second interlayer insulating layers, and the plurality of conductive patterns;

a memory pattern on a sidewall of the hole;

a core insulating pattern in a central region of the hole; and a channel pattern between the core insulating pattern and the memory pattern, wherein the doped semiconductor layer extends to the inside of the hole.

2. The semiconductor memory device of claim 1, wherein the spacer pattern includes a semiconductor layer.

3. The semiconductor memory device of claim 2, wherein the spacer pattern includes single crystalline silicon.

4. The semiconductor memory device of claim 1, wherein the spacer pattern includes a material having an etch selectivity with respect to a semiconductor layer.

5. The semiconductor memory device of claim 4, wherein the spacer pattern includes at least one of a silicon carbide nitride (SiCN) layer and a silicon nitride (SiN) layer.

6. The semiconductor memory device of claim 1, wherein the doped semiconductor layer includes:

a horizontal pattern on the spacer pattern; and a core pattern protruding to the inside of the hole toward the core insulating pattern from the horizontal pattern.

7. The semiconductor memory device of claim 6, wherein the doped semiconductor layer further includes a sidewall pattern extending along the sidewall of the hole toward the memory pattern from the horizontal pattern.

8. The semiconductor memory device of claim 7, wherein a conductive pattern, from the plurality of conductive patterns, that is adjacent to the first interlayer insulating layer is a source select line, and wherein an interface between the memory pattern and the sidewall pattern of the doped semiconductor layer is disposed at a level higher than a level at which the source select line is disposed.

9. The semiconductor memory device of claim 7, wherein the sidewall pattern of the doped semiconductor layer is shorter than the core pattern of the doped semiconductor layer.

10. The semiconductor memory device of claim 1, wherein the core insulating pattern includes a material having an etch selectivity with respect to the memory pattern.

11. The semiconductor memory device of claim 10, wherein the core insulating pattern includes a porous insulating material.

12. The semiconductor memory device of claim 1, wherein the channel pattern is in contact with the doped semiconductor layer, and includes a junction including the same conductivity type impurity as the doped semiconductor layer.

13. The semiconductor memory device of claim 1, wherein the first interlayer insulating layer is thicker than the second interlayer insulating layer.

14. The semiconductor memory device of claim 13, wherein the spacer pattern is thinner than the first interlayer insulating layer.

15. The semiconductor memory device of claim 1, wherein the spacer pattern is thicker than the first interlayer insulating layer.

16. A semiconductor memory device comprising:

a stack structure including a first interlayer insulating layer having a first surface facing in a first direction and a second surface facing in a second direction opposite to the first direction, and a plurality of second interlayer insulating layers and a plurality of conductive patterns, which are alternately disposed in the second direction on the second surface of the first interlayer insulating layer;

a core insulating pattern penetrating the stack structure;

a channel pattern disposed between the core insulating pattern and the stack structure;

a memory pattern disposed between the channel pattern and the stack structure; and a doped semiconductor layer disposed over the first surface of the first interlayer insulating layer, the doped semiconductor layer extending to be connected to the channel pattern, wherein the doped semiconductor layer includes a crystallization region extending between the memory pattern and the core insulating pattern from the channel pattern, and wherein the first interlayer insulating layer includes a first sidewall facing a second sidewall of the core insulating pattern with the memory pattern between the first sidewall and the second sidewall with the crystallization region between the first sidewall and the second sidewall.

17. The semiconductor memory device of claim 16, wherein the core insulating pattern includes an end portion further protruding in the first direction than the first interlayer insulating layer, and wherein the doped semiconductor layer includes a horizontal pattern surrounding the end portion of the core insulating pattern, a first protrusion part extending along the first sidewall of the first interlayer insulating layer from the horizontal pattern, and a second protrusion part extending along a sidewall of the memory pattern from the first protrusion part.

18. The semiconductor memory device of claim 17, wherein the first protrusion part is formed to have a first width between the core insulating pattern and the first interlayer insulating layer, and the second protrusion part is formed to have a second width between the core insulating pattern and the memory pattern, the second width less than the first width.

19. The semiconductor memory device of claim 17, further comprising a metal layer covering the horizontal pattern of the doped semiconductor layer, wherein the doped semiconductor layer extends between the metal layer and the end portion of the core insulating pattern.

20. The semiconductor memory device of claim 16, wherein the first surface of the first interlayer insulating layer further protrudes in the first direction than the core insulating pattern, and wherein the doped semiconductor layer includes a horizontal pattern extending to cover the first interlayer insulating layer, the core insulating pattern, and the memory pattern, and a protrusion part extending between the memory pattern and the core insulating pattern from the horizontal pattern.

* * * * *